United States Patent
Ogihara et al.

(10) Patent No.: US 7,486,307 B2
(45) Date of Patent: Feb. 3, 2009

(54) SEMICONDUCTOR APPARATUS HAVING CONDUCTIVE LAYERS AND SEMICONDUCTOR THIN FILMS

(75) Inventors: Mitsuhiko Ogihara, Hachioji (JP); Hiroyuki Fujiwara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 7 days.

(21) Appl. No.: 11/543,843

(22) Filed: Oct. 6, 2006

(65) Prior Publication Data

US 2007/0023767 A1    Feb. 1, 2007

Related U.S. Application Data

(62) Division of application No. 10/734,620, filed on Dec. 15, 2003, now Pat. No. 7,135,708.

(30) Foreign Application Priority Data

Dec. 24, 2002    (JP)    ............................. 2002-371769

(51) Int. Cl.
| | |
|---|---|
| B41J 2/45 | (2006.01) |
| H01L 27/15 | (2006.01) |
| H01L 29/26 | (2006.01) |
| H01L 31/12 | (2006.01) |
| H01L 33/00 | (2006.01) |
| H01L 29/267 | (2006.01) |
| H01L 29/18 | (2006.01) |
| H01L 29/207 | (2006.01) |
| H01L 23/04 | (2006.01) |
| H01L 23/48 | (2006.01) |
| H01L 23/52 | (2006.01) |
| H01L 29/40 | (2006.01) |

(52) U.S. Cl. ........................ 347/238; 257/79; 257/81; 257/88; 257/93; 257/99; 257/506; 257/698; 257/777; 257/E33.057; 257/E23.141; 257/E23.142; 257/E27.121

(58) Field of Classification Search ................... 257/79, 257/81, 88, 93, 99, 506, 698, 777, E33.057, 257/E23.141, E23.142, E27.121; 347/238
See application file for complete search history.

(56) References Cited

U.S. PATENT DOCUMENTS

| | | | |
|---|---|---|---|
| 3,751,157 A | * | 8/1973 | Johnson ...................... 399/136 |
| 5,317,344 A | | 5/1994 | Beaman et al. |
| 5,734,406 A | | 3/1998 | Nakamura et al. |
| 6,169,564 B1 | * | 1/2001 | Tsukagoshi et al. ......... 347/238 |
| 6,172,701 B1 | | 1/2001 | Tokura et al. |
| 6,313,483 B1 | | 11/2001 | Ogihara et al. |

(Continued)

FOREIGN PATENT DOCUMENTS

JP    60-130050    8/1985

(Continued)

Primary Examiner—Steven Loke
Assistant Examiner—Arman Khosraviani
(74) Attorney, Agent, or Firm—Rabin & Berdo, P.C.

(57) ABSTRACT

A semiconductor apparatus includes a substrate; m electrically conductive layers formed on the substrate, m being an integer of 2 or more, potentials of the m electrically conductive layers being capable of being independently controlled; and semiconductor thin films having at least one semiconductor device respectively. The semiconductor thin films are bonded on surfaces of the m electrically conductive layers respectively.

5 Claims, 19 Drawing Sheets

U.S. PATENT DOCUMENTS 6,388,696 B1 * 5/2002 Taninaka et al. ............ 347/238
6,426,512 B1 * 7/2002 Ito et al. ........................ 257/12
6,614,055 B1 * 9/2003 Kusuda et al. ................. 257/79

FOREIGN PATENT DOCUMENTS

| | | |
|---|---|---|
| JP | 61-270176 | 11/1986 |
| JP | 10-35011 | 2/1998 |
| JP | 10-063807 | 6/1998 |
| JP | 2000-31543 | 1/2000 |
| JP | 2002-141492 | 5/2002 |

* cited by examiner

SEMICONDUCTOR APPARATUS HAVING CONDUCTIVE LAYERS AND SEMICONDUCTOR THIN FILMS

This is a Divisional of U.S. application Ser. No. 10/734,620, filed Dec. 15, 2003, now U.S. Pat. No. 7,135,708, the subject matter of which is incorporated herein by reference.

BACKGROUND OF THE INVENTION

1. Field of the Invention

The present invention relates to a semiconductor apparatus useful in, for example, a light-emitting diode (LED) print head in an electrophotographic printer.

2. Description of the Related Art

FIG. 19 is a perspective view schematically showing a part of a conventional LED print unit, and FIG. 20 is a plan view showing a part of an LED array chip provided to the LED print unit of FIG. 19. Referring to FIG. 19, a conventional LED print unit 900 includes a circuit board 901 on which are mounted a plurality of LED array chips 902 having electrode pads 903, and a plurality of driving integrated circuit (IC) chips 904 having electrode pads 905. The electrode pads 903 and 905 are interconnected by bonding wires 906 through which current is supplied from the driving-IC chips 904 to LEDs 907 formed in the LED array chips 902. Further electrode pads 909 on the driving-IC chips 904 are connected to bonding pads 910 on the circuit board 901 by further bonding wires 911.

For reliable wire bonding, the electrode pads 903, 905, and 909 must be comparatively large, e.g., one hundred micrometers square (100 μm×100 μm), and the LED array chips 902 must have approximately the same thickness as the driving-IC chips 904 (typically 250-300 μm), even though the functional parts of the LED array chips 902 (the LEDs 907) have a depth of only about 5 μm from the surface. To accommodate the needs of wire bonding, an LED array chip 902 must therefore be much larger and thicker than necessary simply to accommodate the LEDs 907. These requirements drive up the size and material cost of the LED array chips 902.

As shown in plan view in FIG. 20, the electrode pads 903 may need to be arranged in a staggered formation on each LED array chip 902. This arrangement further increases the chip area and, by increasing the length of the path from some of the LEDs 907 to their electrode pads 903, increases the associated voltage drop.

The size of the driving-IC chips 904 also has to be increased to accommodate the large number of bonding pads 905 by which they are interconnected to the LED array chips 902.

Light-emitting elements having a thin-film structure are disclosed in Japanese Patent Laid-Open Publication No. 10-063807 (FIGS. 3-6, FIG. 8, and paragraph 0021), but these light-emitting elements have electrode pads for solder bumps through which current is supplied. An array of such light-emitting elements would occupy substantially the same area as a conventional LED array chip 902.

SUMMARY OF THE INVENTION

It is an object of the present invention to provide a semiconductor apparatus having conductive layers and semiconductor thin films, wherein the apparatus can reduce its size and material cost.

According to the present invention, a semiconductor apparatus includes a substrate; m electrically conductive layers formed on the substrate, m being an integer of 2 or more, potentials of the m electrically conductive layers being capable of being independently controlled; and semiconductor thin films having at least one semiconductor device respectively, the semiconductor thin films being bonded on surfaces of the m electrically conductive layers respectively.

DETAILED DESCRIPTION OF THE INVENTION

Figure 1:
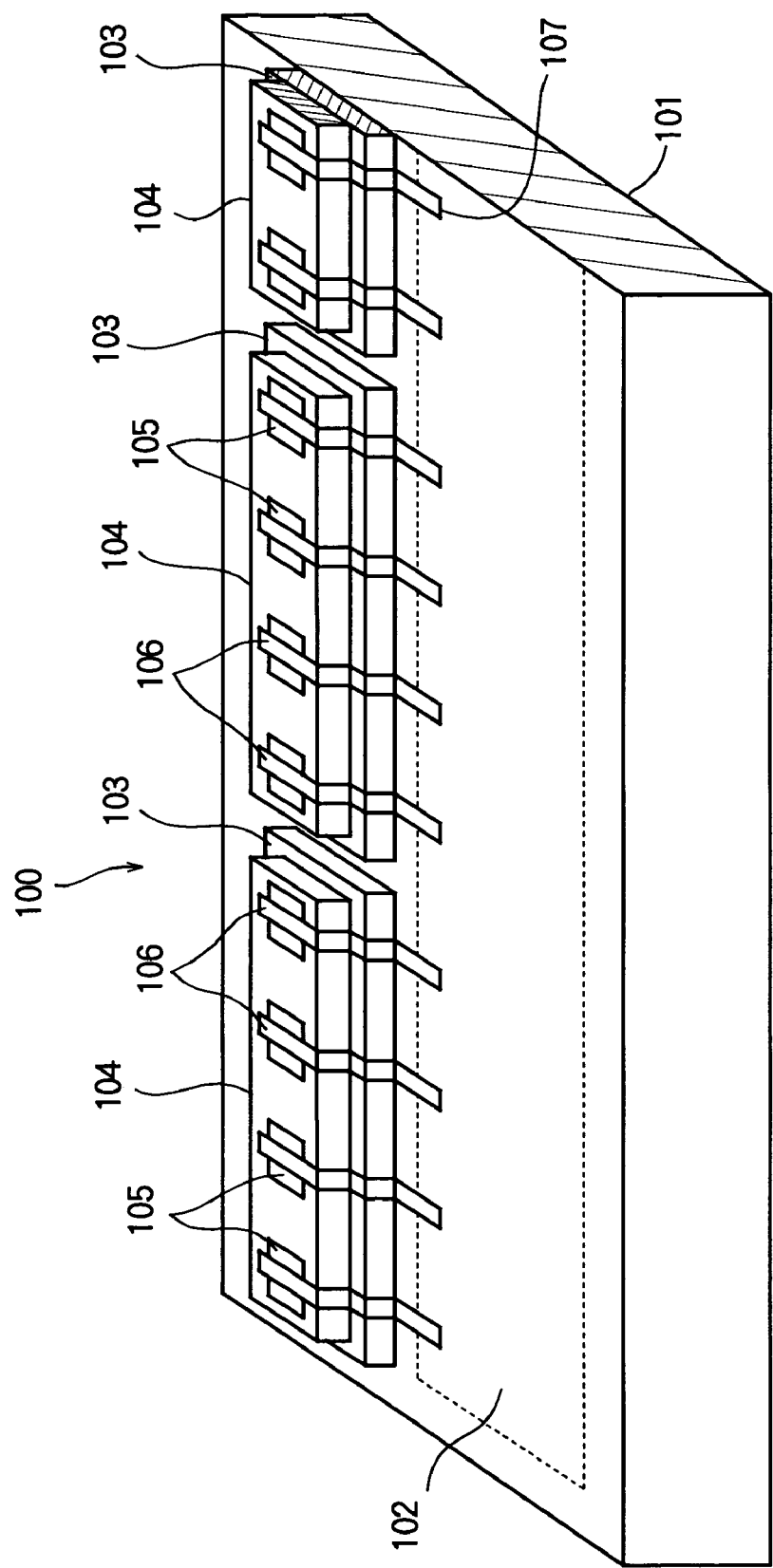
FIG. 1 is a perspective view schematically showing a part of an integrated LED/driving-IC chip in accordance with a first embodiment of the present invention.

Embodiments of the invention will now be described with reference to the attached drawings, in which like elements are indicated by like reference characters.

First Embodiment

Figure 2:
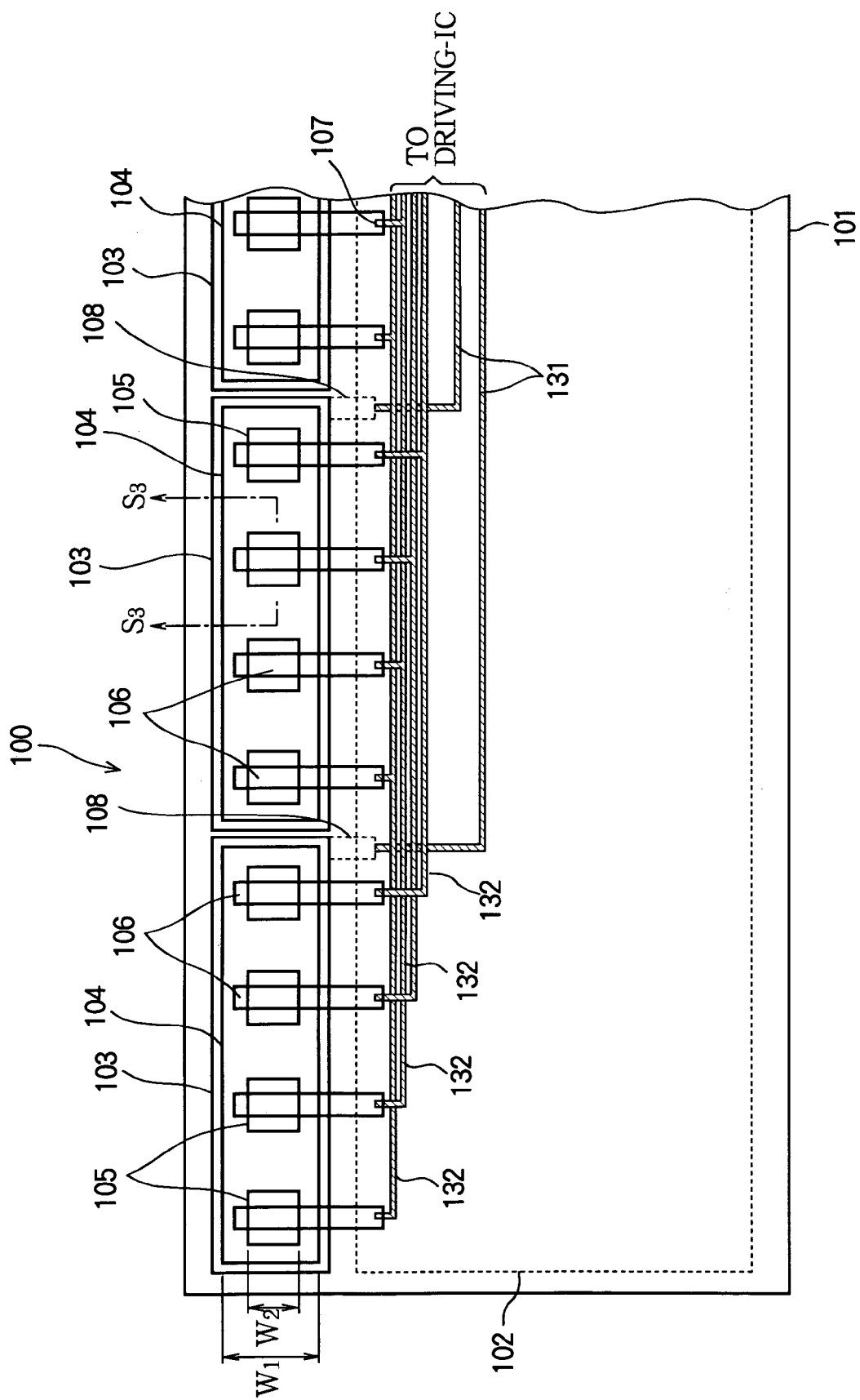
FIG. 2 is a plan view schematically showing a part of the integrated LED/driving-IC chip of the first embodiment.
Figure 3:
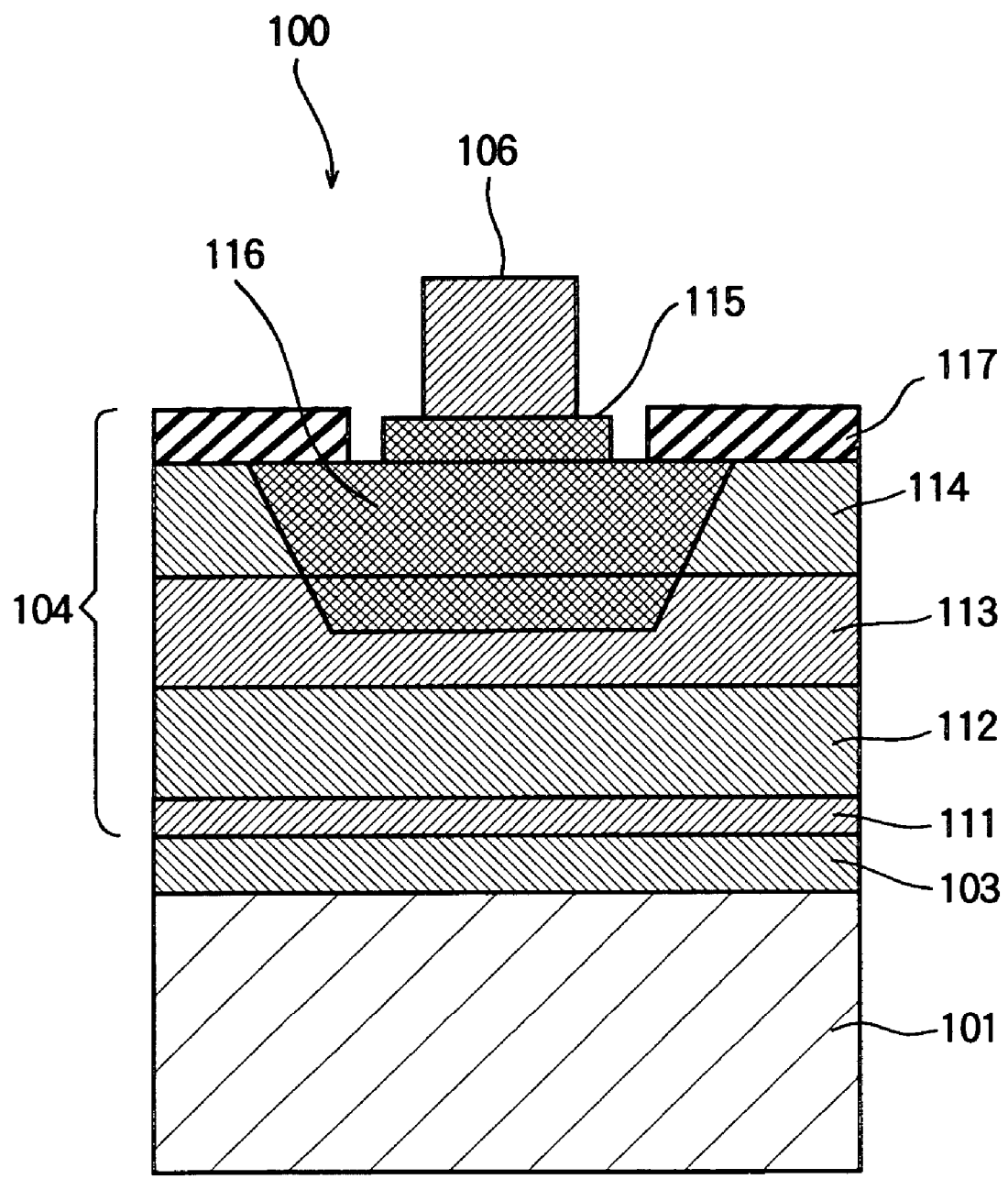
FIG. 3 is a schematic cross sectional view showing a cross section through line $S_3$-$S_3$ in FIG. 2.
Figure 4:
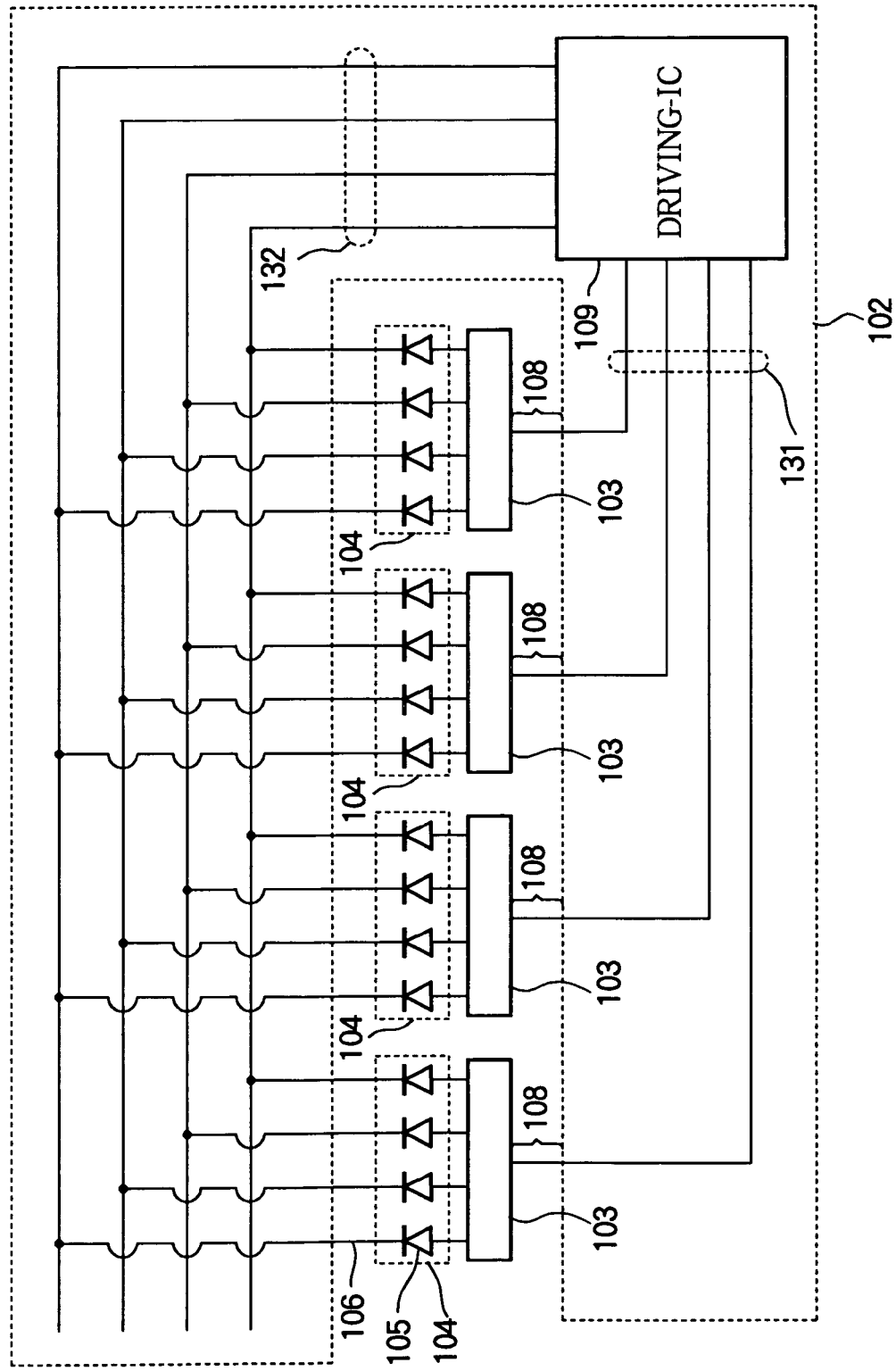
FIG. 4 is a circuit diagram of the integrated LED/driving-IC chip of the first embodiment.

FIG. 1 is a perspective view schematically showing a part of an integrated LED/driving-IC chip 100 as a semiconductor apparatus in accordance with a first embodiment of the present invention. FIG. 2 is a plan view schematically showing a part of the integrated LED/driving-IC chip 100 of the first embodiment, and FIG. 3 is a schematic cross sectional view showing a cross section through line $S_3$-$S_3$ in FIG. 2. FIG. 4 is a circuit diagram of the integrated LED/driving-IC chip 100 of the first embodiment.

As shown in FIGS. 1 to 4, an integrated LED/driving-IC chip 100 of the first embodiment includes a silicon (Si) substrate 101 having an integrated circuit 102, and m (m being an integer of 2 or more) metal layers 103 formed on the Si substrate 101 so that potentials of the metal layers 103 are capable of being independently controlled. The integrated LED/driving-IC chip 100 also includes epitaxial films 104 as sheet-like semiconductor thin films, which are bonded on the associated m metal layers 103 respectively. Each epitaxial film 104 has n (n being an integer of 2 or more) LEDs 105. The integrated LED/driving-IC chip 100 further includes a plurality of individual interconnecting lines 106, each of which extends from an upper surface of the LED 105 to an upper surface of an individual electrode region 107 of the Si substrate 101.

As shown in FIGS. 2 to 4, further, the integrated LED/driving-IC chip 100 of the first embodiment also includes m common wiring lines 131 provided in the integrated circuit 102 so that potentials of the common wiring lines 131 are capable of being controlled independently of each other, and n signal wiring lines 132 provided in the integrated circuit 102 so that potentials of the signal wiring lines 132 are capable of being controlled independently of each other. The m common wiring lines 131 and the n signal wiring lines 132 are electrically connected to a driving-IC 109, which may be a part of the integrated circuit 102 or a separate device electrically connected to the integrated circuit 102. The driving-IC 109 independently controls the potentials of the m common wiring lines 131 and the potentials of the n signal wiring lines 132. The m common wiring lines 131 and the m electrically conductive layers 103 are electrically connected to each other in a one-to-one correspondence. For this reason, the driving-IC 109 can independently control the potentials of the m electrically conductive layers 103. For example, the driving-IC 109 can selectively connect the m electrically conductive layers 103 to ground. Therefore, the driving-IC 109 can control potentials of the LEDs 105 on the side of the common electrodes.

The k-th one (k=1, 2, ..., n) of the n LEDs 105 provided on each of the m electrically conductive layers 103 is electrically connected to the k-th one of the n signal wiring lines 132, where k indicates an order in an array of the n LEDs 105 or an arrangement of the n signal wiring lines 132. Therefore, the k-th one of the n second-conductive-type semiconductor layers and the k-th one of the n signal wiring lines 132 are electrically connected to each other in a one-to-one correspondence. For this reason, the driving-IC 109 can independently control the potentials of the n signal wiring lines 132, and thus can control potentials of the LEDs 105 on the side of the individual electrodes. Although FIG. 4 shows a case of m=4 and n=4, the values of m and n are not restricted to such values.

As shown in FIGS. 1 to 3, the n LEDs (also referred to below as light-emitting parts or regions) 105 formed in the LED epitaxial films 104 are arranged in a row at regular intervals. The n LEDs 105 may not be arranged at regular intervals. Furthermore, the arrangement of the n LEDs 105 is not limited to a single row, but the n LEDs 105 may be arranged as regularly shifted in a direction perpendicular to a direction of the arrangement of the n LEDs 105. Further, as shown in FIG. 2, the LED epitaxial films 104 have a width $W_1$ larger than a width $W_2$ of the light-emitting regions of the LEDs 105. For example, the width $W_2$ of the light-emitting regions of the LEDs 105 is set to be 20 µm, and the width $W_1$ of the LED epitaxial films 104 is set to be 50 µm, so that a margin of 15 µm is provided to each of both sides of the light-emitting regions 105. The width $W_1$ of the LED epitaxial films 104 is much smaller than width (typically, about 400 µm) of a substrate of the conventional LED print head having electrode pads. However, the width $W_1$ of the LED epitaxial films 104 and the width $W_2$ of the light-emitting regions of the LEDs 105 are not limited to the aforementioned values.

It is desirable that the LED epitaxial film 104 be made of only epitaxial layers to be explained later. The thickness of the LED epitaxial film 104 may be about 2 µm that is sufficient to secure stable characteristics (e.g., light-emitting characteristics or electrical characteristics) of the LED. The thickness of the LED epitaxial film 104 is much smaller than the thickness (typically, about 300 µm) of the conventional LED print head. As the thickness of the LED epitaxial film 104 is increased, a disconnection due to poor step coverage tends to probably occur in the thin-film wiring layer (e.g. the individual wiring lines 106) formed on the LED epitaxial film 104. In order to avoid occurrence of the disconnection, it is desirable that the LED epitaxial film 104 have a thickness of about 10 µm or less. In this connection, by taking measures, e.g., to planarize the stepped zone with use of insulating material such as polyimide, it is also possible to set the thickness of the LED epitaxial film 104 to exceed 10 µm.

The Si substrate 101 is a monolithic Si substrate, in which the integrated circuit 102 is formed. The integrated circuit 102 includes a plurality of driving-ICs for driving the LEDs 105 formed in the LED epitaxial film 104. Besides the driving circuits, the integrated circuit 102 includes shared circuitry for illumination control of the LEDs 105. The Si substrate 101 has a thickness of about 300 µm, for example. The other materials such as amorphous silicon, single crystal silicon, polysilicon, compound semiconductor, organic semiconductor, and insulating material (such as glass or sapphire) can be used as the substrate material. In addition, the Si-substrate 101 including the integrated circuit 102 can be replaced, for example, by an insulating substrate and an integrated circuit device (109 in FIG. 4) mounted thereon.

The metal layers 103 are formed on the surface of the substrate 101 in a region adjacent to but not overlapping the part in which the integrated circuit 102 is formed. The metal layers 103 are, for example, palladium or gold films with a thickness of about one hundred nanometers (100 nm =0.1 µm). The LED epitaxial films 104 are bonded to the surfaces of the metal layers 103. The functions of the metal layers 103 include both bonding the LED epitaxial films 104 on the surface of the substrate 101 and electrical connecting a common electrode layer of the bottom surface of the LED epitaxial film to a common electrode area on the Si substrate 101. It is desirable that an ohmic contact be created between the metal layers 103 and the common electrode area of the bottom surface of the LED epitaxial film 104 and between the metal layers 103 and the common electrode area (e.g., reference numeral 108 in FIG. 2) of the Si substrate 101. The common electrode areas of the LED epitaxial films 103 in this embodiment is an n-type GaAs layer 111 that occupies the entire bottom surface of the LED epitaxial film. The common electrode layer of the Si substrate 101 indicates the entire surface of the Si substrate 101 contacting the metal layers 103 provided on the Si substrate 101. The metal layers 103 may be formed on the surface of the Si substrate 101 in a region where the integrated circuit 102 is formed (so as to wholly or partly overlapped therewith) while providing an insulating layer between the metal layer 103 and the surface of the Si substrate 101.

As shown in FIGS. 2 and 4, the individual interconnecting lines 106 electrically connect upper surfaces of the light-emitting regions 105 of the LED epitaxial films 104 and the individual electrode regions 107 of the Si substrate 101. The individual interconnecting lines 106 may be formed by patterning a thin electrically conductive film such as a metal film. Specific examples of suitable films of the individual interconnecting lines 106 include (1) a film containing gold (Au), e.g., a single-layer gold film, a multi-layer film with titanium, platinum, and gold layers (a Ti/Pt/Au film), a multi-layer film with gold and zinc layers (an Au/Zn film), or a multi-layer film with a gold layer and a gold-germanium-nickel layer (an AuGeNi/Au film); (2) a film containing palladium (Pd), e.g., a single-layer palladium film or a multi-layer film with palladium and gold layers (a Pd/Au film); (3) a film containing aluminum (Al), e.g., a single-layer aluminum film or a multi-layer film with aluminum and nickel layers (an Al/Ni film); (4) a polycrystalline silicon (polysilicon) film; (5) a thin, electrically conductive oxide film such as an indium tin oxide (ITO) film or a zinc oxide (ZnO) film.

In each of the individual interconnecting lines 106, the material of a contact part with the LED 105 may be different from the material of the other part. In this case, the above metal material and electrically conductive oxide materials may be suitably combined and used. All of the individual interconnecting lines 106 can be formed simultaneously. When the individual interconnecting lines 106 are formed from a thin film, since their width is restricted by the array pitch of the LEDs 105, a significant voltage drop will occur if the individual interconnecting lines 106 are too long. When several milliamperes of driving current is supplied through an individual interconnecting line 106 that is 5 μm wide and 0.5 μm thick, for example, length of the individual interconnecting line is preferably less than about 200 μm.

An interdielectric thin film is provided in a region where electric short-circuiting should be avoided, for example, between the individual interconnecting lines 106 and top- and side-surface of the LED epitaxial films 104, between the individual interconnecting lines 106 and the metal layers 103, between the individual interconnecting lines 106 and the surface of the Si substrate 101, between the individual interconnecting lines 106 and the surface of the Si substrate 101 in the region where the integrated circuit 102 is formed, or the like, thereby securing normal operation. The individual interconnecting lines 106 must cross steps, such as the step at the edge of the metal layer 103 and steps at the edges of openings in the interlayer dielectric film. To prevent short- and open-circuit faults in the individual interconnecting lines 106 at these steps, the interlayer dielectric film is preferably formed by a method such as a plasma chemical vapor deposition (P-CVD) method that provides good step coverage. The steps may also be planarized with a polyimide film, a spin-on-glass film, or other interdielectric thin film (e.g., silicon oxide or silicon nitride).

The cross sectional structure of the first embodiment will next be described. Referring to FIG. 3, the integrated LED/driving-IC chip 100 has a structure of the Si substrate 101, the metal layer 103, the LED epitaxial film 104, and the individual interconnecting line 106, which are formed in this order. Referring to FIG. 3, the LED epitaxial film 104 includes, from the bottom up, an n-type gallium arsenide (GaAs) layer 111 and three n-type aluminum gallium arsenide (AlGaAs) layers: an $Al_xGa_{1-x}As$ lower cladding layer 112 ($0 \leq x \leq 1$), an $Al_yGa_{1-y}As$ active layer 113 ($0 \leq y \leq 1$), and an $Al_zGa_{1-z}As$ upper cladding layer 114 ($0 \leq z \leq 1$). A second n-type GaAs contact layer 115 is formed on the n-type $Al_zGa_{1-z}As$ layer 114 and then p-type impurity of zinc (Zn) is selectively diffused into the epitaxial layers so that the Zn-diffusion front is in the active layer 113. The insulating thin film 117 is formed to cover the upper surface of the substrate and the individual electrode 106 is formed on the p-type (Zn-diffused) contact layer 115. Light is emitted when forward current is supplied across the pn junction between the p-type and n-type regions.

The n-type GaAs layer 111 is about 10 nm (0.01 μm) thick, the n-type $Al_xGa_{1-x}As$ lower cladding layer 112 about 0.5 μm thick, the n-type $Al_yGa_{1-y}As$ active layer 113 about 1 μm thick, the n-type $Al_zGa_{1-z}As$ upper cladding layer 114 about 0.5 μm thick, and the p-type GaAs contact layer 115 about 10 nm (0.01 μm) thick. The total thickness of the LED epitaxial film 104 is about 2.02 μm.

The aluminum composition ratios x, y, z of the AlGaAs layers are preferably selected so that x>y and z>y (e.g., x=z=0.4, y=0.1), and the diffusion front of the zinc diffusion region 116 is preferably located within the n-type $Al_yGa_{1-y}As$ active layer active 113. In this structure, minority carriers injected through the pn junction are confined within the n-type $Al_yGa_{1-y}As$ active layer 113 and the p-type $Al_yGa_{1-y}As$ region created therein by zinc diffusion, so that high luminous efficiency is obtained. The structure shown in FIG. 3 enables high luminous efficiency to be obtained with an LED epitaxial film 104 as thin as about 2 μm.

The LED epitaxial film 104 is not limited to thicknesses or materials given above. Other materials, such as an aluminum-gallium indium phosphide $((Al_xGa_{1-x})_yIn_{1-y}P$, where $0 \leq x \leq 1$ and $0 \leq y \leq 1$, a gallium nitride (GaN), an aluminum gallium nitride (AlGaN), and an indium gallium nitride (InGaN), may also be employed. Other than a double hetero-epitaxial structure described in FIG. 3, a single hetero-epitaxial structure and a homo-epitaxial structure can be also applied in LEDs.

Figure 7:
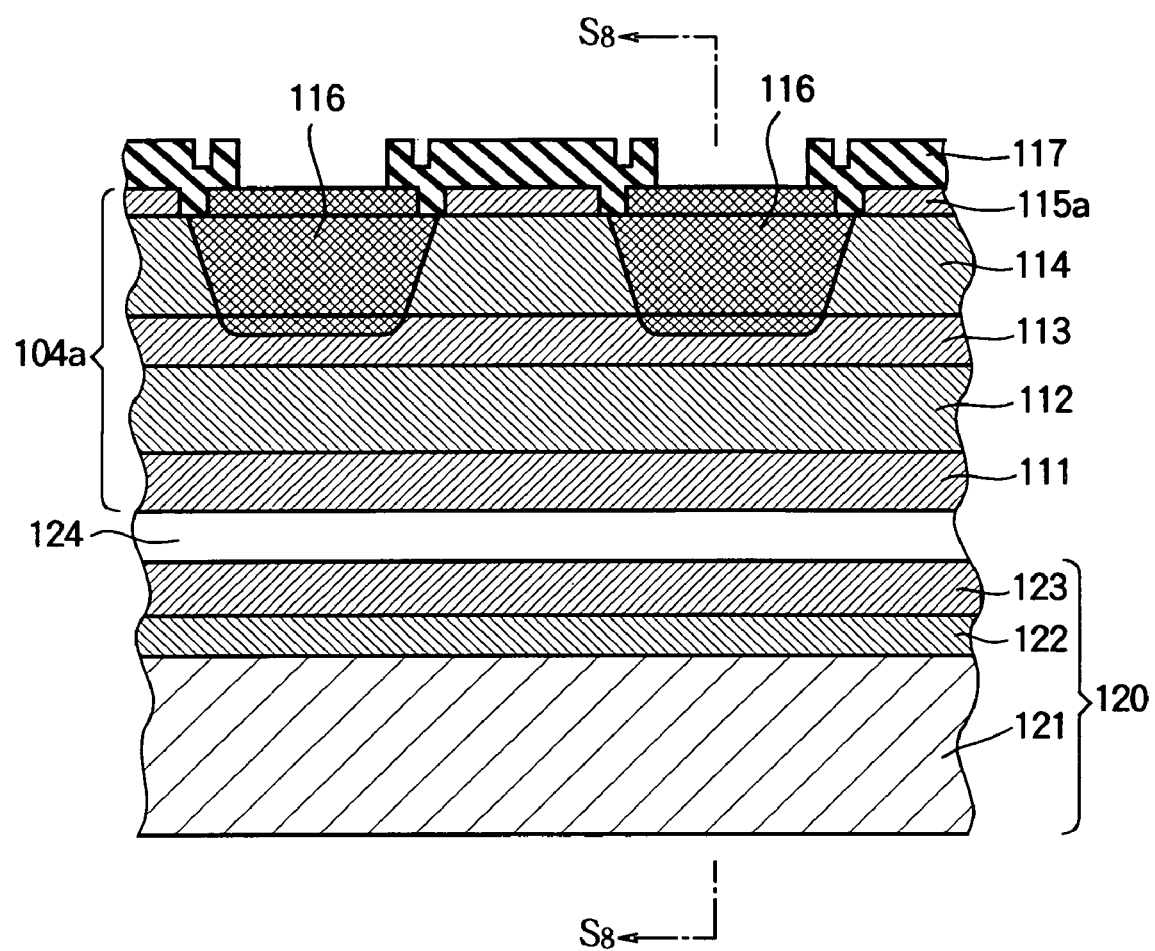
FIG. 7 is a schematic cross sectional view for explaining a third process of fabricating an LED epitaxial film of the first embodiment.
Figure 8:
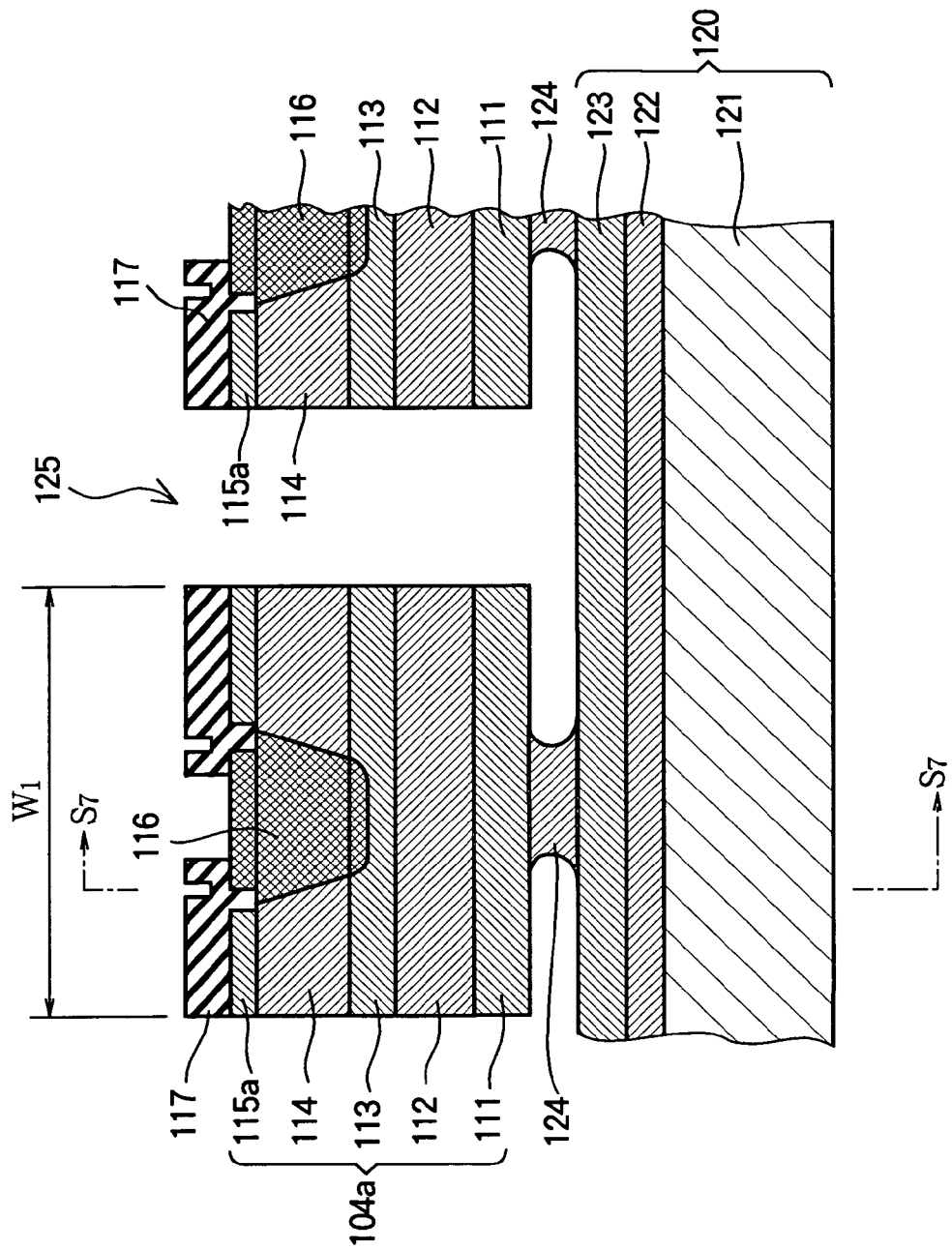
FIG. 8 is a schematic cross sectional view showing a cross section through line $S_8$-$S_8$ in FIG. 7.

Next, a fabrication process for the LED epitaxial film 104 will be described with reference to FIGS. 5 to 8, which are schematic cross sectional views for explaining process of fabricating an LED epitaxial film of the first embodiment. Further, FIG. 8 shows a cross section through line $S_8$-$S_8$ in FIG. 7, and FIG. 7 shows a cross section through line $S_7$-$S_7$ in FIG. 8.

Figure 5:
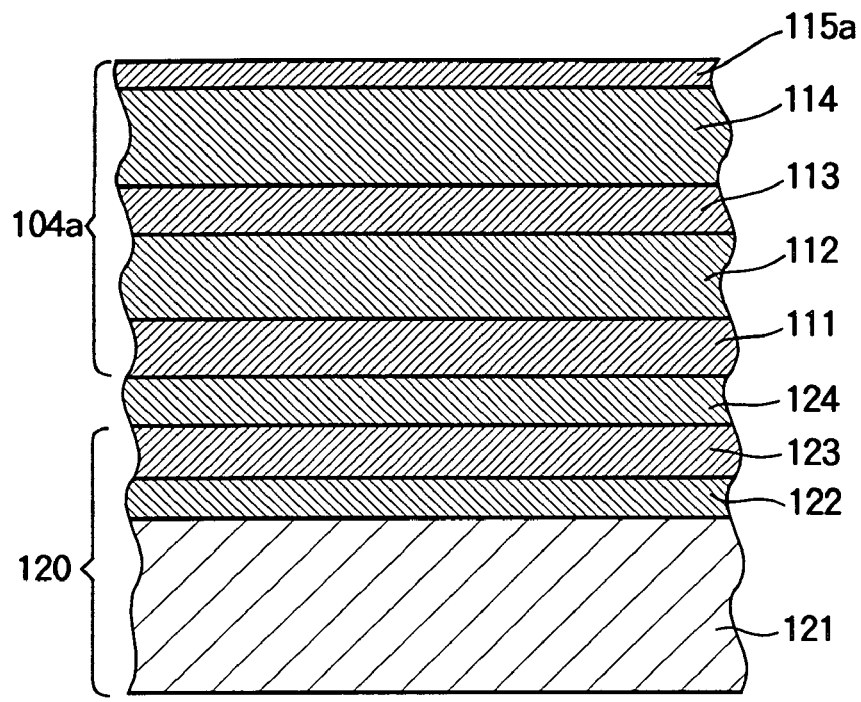
FIG. 5 is a schematic cross sectional view for explaining a first process of fabricating an LED epitaxial film of the first embodiment.

Referring to FIG. 5, the fabrication process begins with the formation of an LED epitaxial layer 104a on a fabrication substrate 120 by the techniques such as metal organic chemical vapor deposition (MOCVD) or molecular beam epitaxy (MBE). After lifting off the LED epitaxial layer 104a, it becomes the LED epitaxial film 104. The fabrication substrate 120 in FIG. 5 includes a GaAs substrate 121, a GaAs buffer layer 122, an aluminum-gallium indium phosphide ((AlGa)InP) etching stop layer 123, and an aluminum arsenide (AlAs) sacrificial layer 124. The n-type GaAs contact layer 111, n-type $Al_xGa_{1-x}As$ lower cladding layer 112, n-type $Al_yGa_{1-y}As$ active layer 113, n-type $Al_zGa_{1-z}As$ upper cladding layer 114, and n-type GaAs contact layer 115a are formed in this order on the AlAs sacrificial layer 124, creating an LED epitaxial layer 104a. Lifting-off of the LED epitaxial layer 104a can be carried out by a chemical lift off method. Furthermore, the (AlGa)InP etching stop layer 123 can be omitted.

A diffusion mask layer (dielectric film) is formed on the LED epitaxial layer 104a and openings are created. P-type impurity comprising zinc (Zn) is diffused through the openings by, for example, solid-phase diffusion to create the zinc diffusion regions 116. The diffusion source film (not shown in the figures) used for the solid-phase diffusion process is then removed to expose the surface of the GaAs contact layer 115 in the zinc diffusion regions 116. Due to the p-type impurity diffusion, the n-type GaAs contact layer 115 has become a p-type GaAs contact layer in these diffusion regions. Part of the second GaAs layer (115a) including pn-junction is etched to remove.

Figure 6:
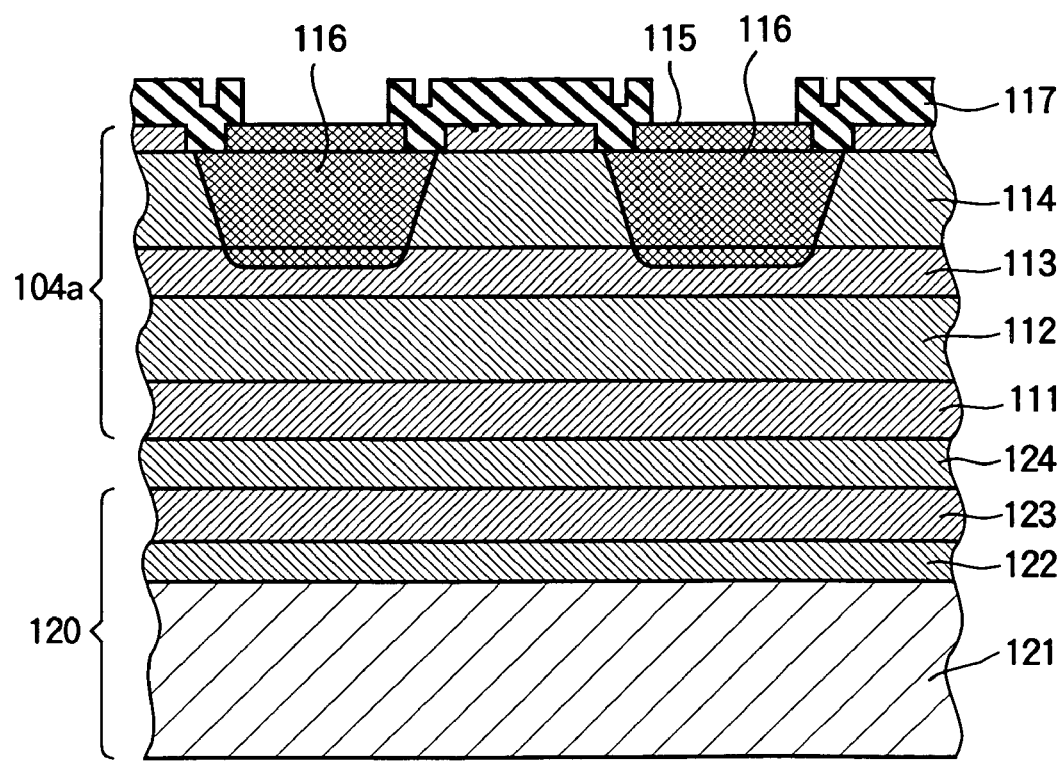
FIG. 6 is a schematic cross sectional view for explaining a second process of fabricating an LED epitaxial film of the first embodiment.

Referring to FIG. 6, an interlayer dielectric film 117 is now formed, openings are created therein.

As shown in FIGS. 7 and 8, the AlAs sacrificial layer 124 is selectively removed with use of a 10% HF (hydrogen fluoride) solution. Since an etching rate for the AlAs sacrificial layer 124 is much larger than an etching rate for the AlGaAs layers 112 to 114, GaAs layers 111, 121, 122, and etching stop layer 123; the AlAs sacrificial layer 124 can be selectively etched. As a result, the LED epitaxial layer 104a (LED epitaxial film 104) can be lifted off from the LED epitaxial film fabrication substrate 120.

In this connection, for the purpose of making the LED epitaxial film 104 thin and also to lift off the LED epitaxial film 104 from the LED epitaxial film fabrication substrate 120 in a comparative short time, it is desirable that the LED epitaxial film 104 have a width of 300 μm or less, e.g., about 50 μm. To this end, as shown in FIG. 8, the respective epitaxial layers 111 to 114 and 115a are previously etched so that trenches 125 are made therein and the layers have a width $W_1$ of 50 μm. The formation of the trenches 125 are carried out by photolithography for masking the epitaxial layers with use of resist for the trench formation and etching the epitaxial layers using a phosphate peroxide etchant (i.e., a solution of phosphoric acid and hydrogen peroxide). For simplicity, only one trench 125 is shown in FIG. 8. The phosphate peroxide etchant etches the AlGaAs layers 112 to 114 and GaAs layers 111, 115a, 121, 122. However, since the etching rate of the etchant for the etching stop layer 123 is low, the trench 125 formed from the upper surface can be prevented from arriving at the GaAs substrate 121 during the etching. The trench 125 may be formed after removing part of the interdielectric thin film on the trench formation area. The removing process of part of the interdielectric thin film may be carried out using a resist mask for formation of the trench 125. After the trench 125 is formed, the AlAs sacrificial layer 124 is etched using the HF solution and then the LED epitaxial film 104 is lifted off. Although the AlAs sacrificial layer 124 is illustrated as still remain (as etched halfway) in FIG. 8, the AlAs sacrificial layer 124 is completely removed in such a condition as to carry the LED epitaxial film 104. After the AlAs sacrificial layer 124 has been completely removed by etching, the LED epitaxial film 104 is immersed in deionized water so that no etching solution residue remains. When lifting off the LED epitaxial film 104, a supporting material for carrying and protecting the LED epitaxial film can be provided on the LED epitaxial film 104. For example, when the supporting material is provided on the LED epitaxial film 104, the supporting material can be transferred to a predetermined position by sucking the surface of the supporting material by vacuum suction or bonding the surface of the supporting material by a photo-hardening adhesive sheet, which hardens and loses its adhesive property when subjected to light irradiation.

In the integrated LED/driving-IC chip 100 of the first embodiment, since it is not necessary to provide electrode pads for wire bonding on the LED epitaxial film 104, space can be saved and the area occupied by the LED epitaxial film 104 can be much smaller than the area occupied by a conventional LED array chip. Furthermore, since the LED epitaxial film 104 is supported by the Si substrate 101 and need not be thickened to provide strength for wire bonding, it can be much thinner than a conventional LED array chip. These effects lead to a substantial reduction in material costs.

In the integrated LED/driving-IC chip 100 of the first embodiment, furthermore, when compared with a system having a driver circuit for each LED, the surface area of the integrated circuit 102 can be decreased.

In the integrated LED/driving-IC chip 100 of the first embodiment, in addition, the common wiring lines 131 and signal wiring lines 132 requiring a large surface area are provided not on the LED epitaxial films 104 made of expensive compound semiconductor but on the Si substrate 101 or within the Si substrate 101. As a result, the material cost can be reduced.

Figure 9:
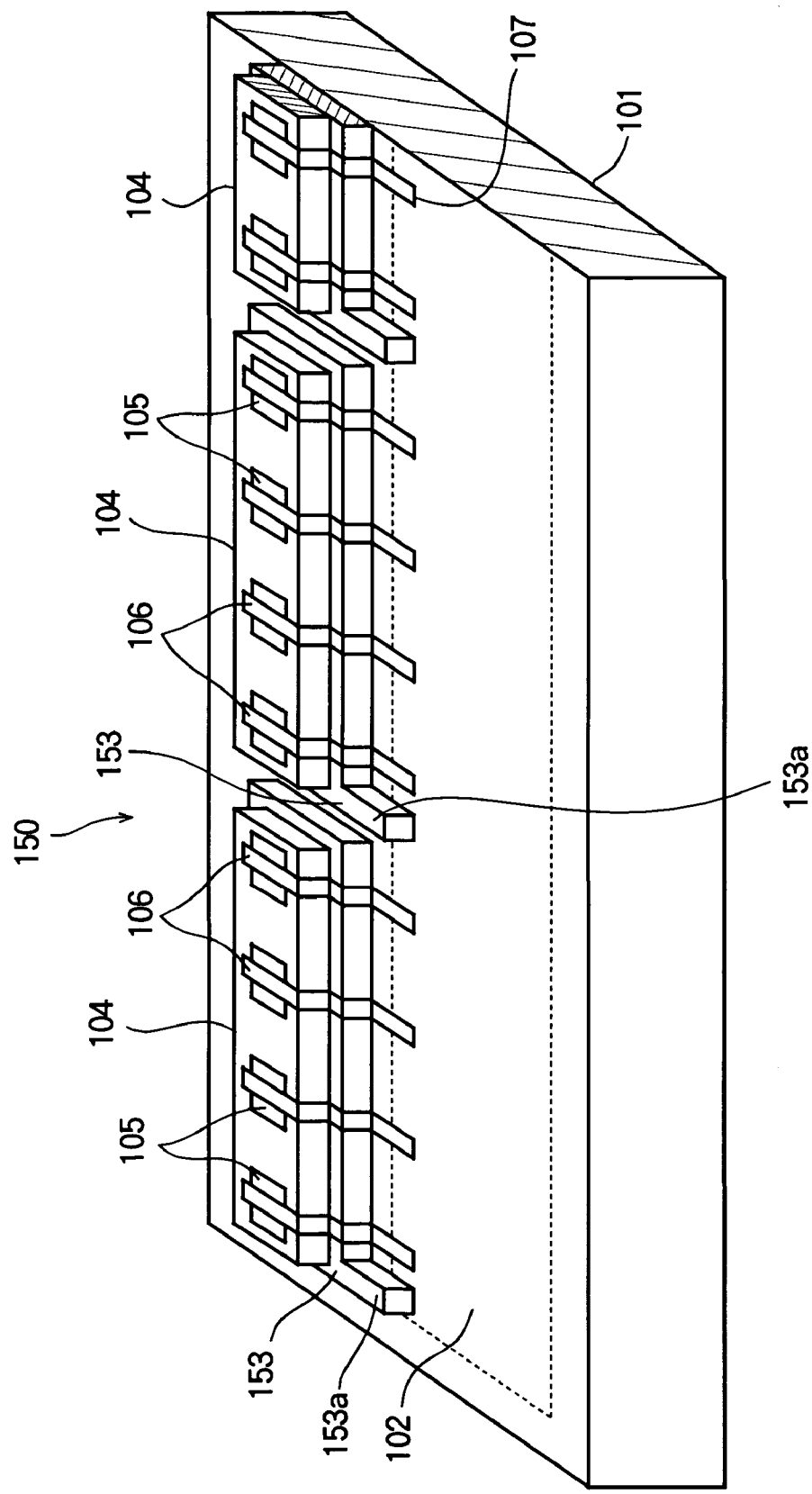
FIG. 9 is a perspective view schematically showing an integrated LED/driving-IC chip in accordance with a modification of the first embodiment.

FIG. 9 is a perspective view schematically showing an integrated LED/driving-IC chip 150 as a semiconductor apparatus in accordance with a modification of the first embodiment of the present invention. In FIG. 9, parts that are the same as or correspond to those in FIG. 1 (first embodiment) are denoted by the same reference numerals. The integrated LED/driving-IC chip 150 shown in FIG. 9 is different from that of FIG. 1 in the shape of metal layers 153. In FIG. 1, the metal layers 103 are electrically connected with the common electrode regions 108 (electrode area extending from the integrated circuit 102) of the Si substrate 101. In FIG. 9, on the other hand, extensions 153a of the metal layers 153 are extended up to the upper surface of the common electrode region of the integrated circuit 102. The example of FIG. 9 is the same as the aforementioned first embodiment shown in FIGS. 1 to 4, except for the above-described respects. In this connection, as how to connect the metal layers 103 to the signal wiring lines 132, another method other than the above specific example may be employed.

Second Embodiment

Figure 10:
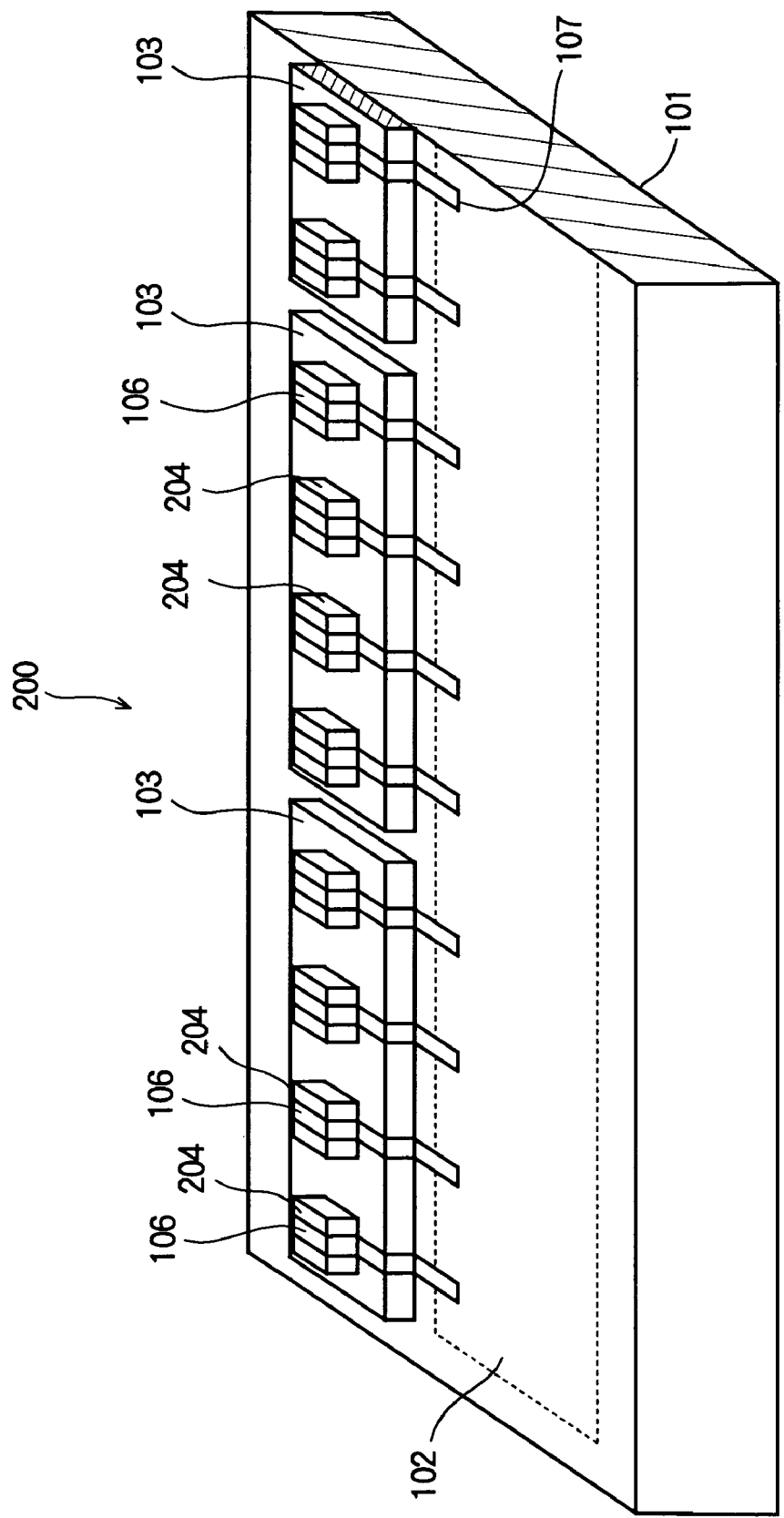
FIG. 10 is a perspective view schematically showing a part of an integrated LED/driving-IC chip in accordance with a second embodiment of the present invention.
Figure 11:
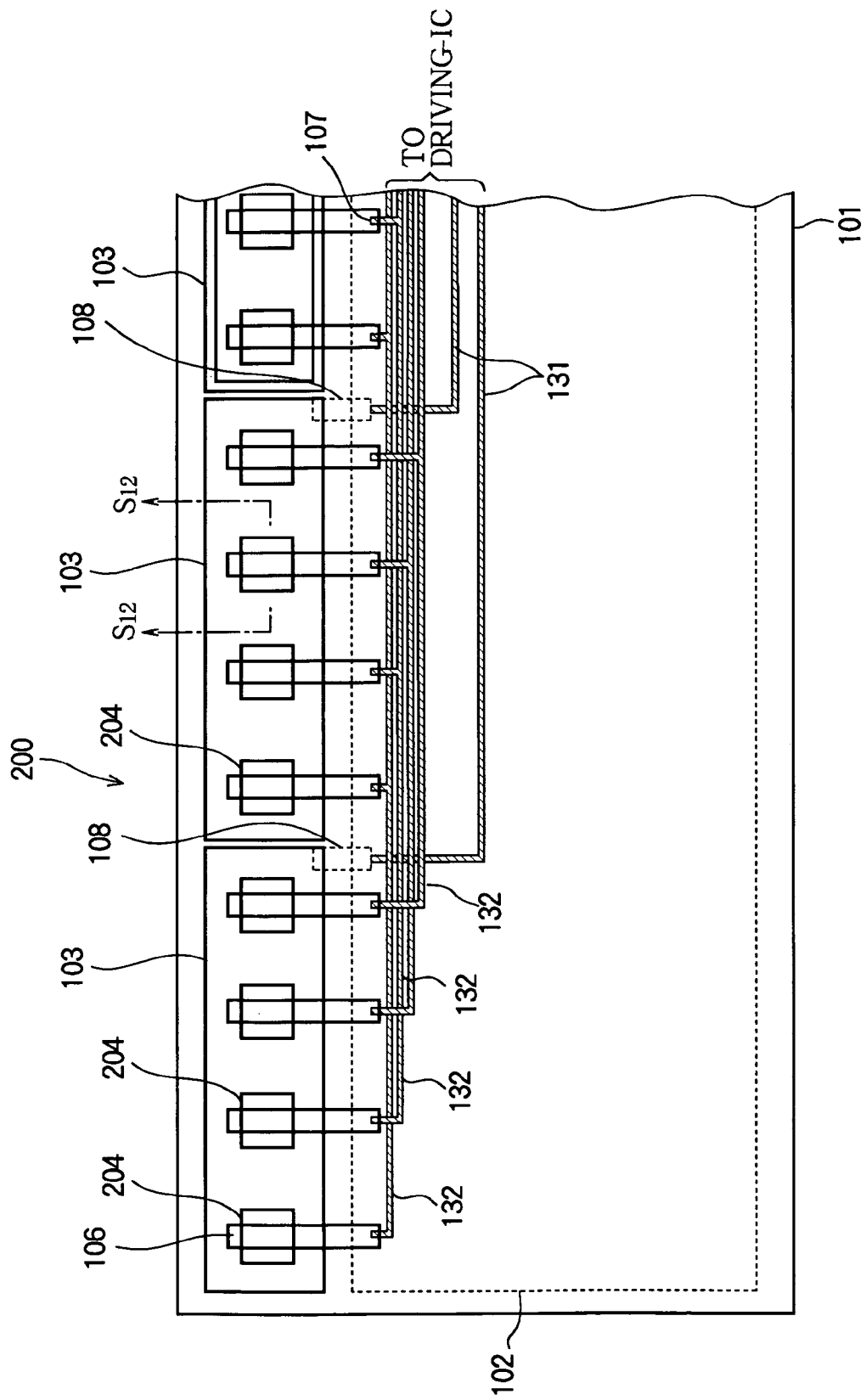
FIG. 11 is a plan view schematically showing a part of the integrated LED/driving-IC chip of the second embodiment.

FIG. 10 is a perspective view schematically showing a part of an integrated LED/driving-IC chip 200 as a semiconductor apparatus in accordance with a second embodiment of the present invention, and FIG. 11 is a plan view schematically showing a part of the integrated LED/driving-IC chip 200 of the second embodiment. Further, FIG. 12 is a schematic cross sectional view showing a cross section through line $S_{12}$-$S_{12}$ in FIG. 11.

In FIG. 10, parts that are the same as or correspond to those in FIG. 1 (first embodiment) are denoted by the same reference numerals. In FIG. 11, parts that are the same as or correspond to those in FIG. 2 (first embodiment) are denoted by the same reference numerals. In FIG. 12, parts that are the same as or correspond to those in FIG. 3 (first embodiment) are denoted by the same reference numerals. An integrated LED/driving-IC chip 200 shown in FIGS. 10 and 11 is different from the integrated LED/driving-IC chip 100 of the first embodiment shown in FIGS. 1 and 2 in that n LED epitaxial films 204 are bonded on each of the metal layers 103 and that each LED epitaxial film 204 has a single LED 106.

Figure 12:
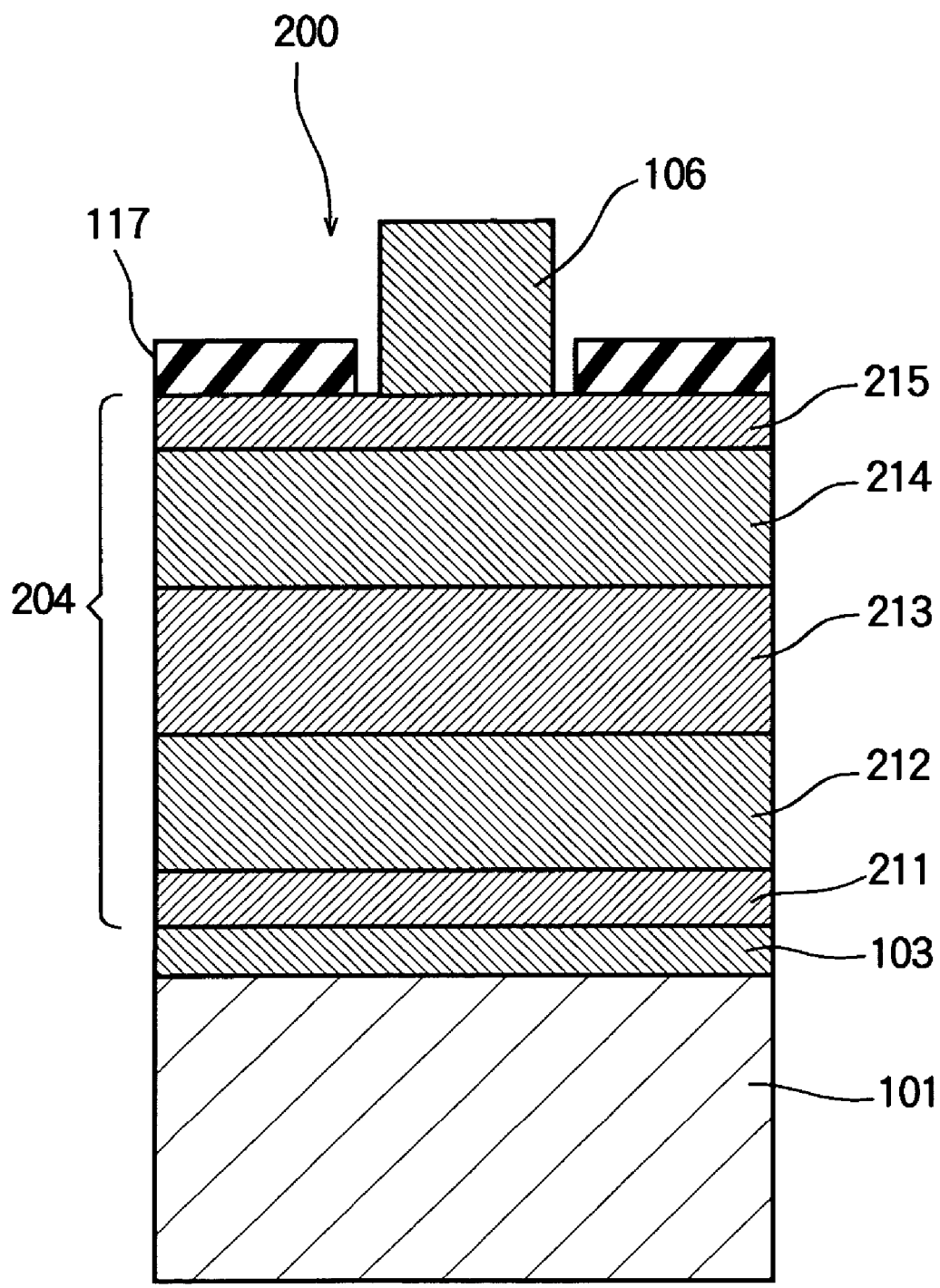
FIG. 12 is a schematic cross sectional view showing a cross section through line $S_{12}$-$S_{12}$ in FIG. 11.

As shown in FIG. 12, the LED epitaxial film 204 has a laminated structure in which a p-type $Al_xGa_{1-x}As$ layer 212, a p-type $Al_yGa_{1-y}As$ layer 213, an n-type $Al_zGa_{1-z}As$ layer 214 and an n-type GaAs layer 215 are sequentially formed, from the bottom up, on a p-type GaAs layer 211. An interdielectric thin film 117 is formed on the n-type GaAs layer 215, and the individual interconnecting lines 106 are formed on a region extending from openings of the interdielectric thin film 117 to the individual electrode regions 107 of the integrated circuit 102. The Al composition of each of the above layers can be set to satisfy a relation of x>y and z>y (e.g., x=z=0.4 and y=0.1). However, the structure and composition of the LED epitaxial film 204 are not limited to such those as mentioned above. The LED shown in FIG. 12 has a double hetero-junction structure, but it is also possible to fabricate LEDs with a single hetero-junction structure or a homojunction structure. Further, various types of structures including provision of non-doped active layer between cladding layers or insertion of a quantum-well layer between in the cladding layers can be employed. Such a modification as a p-type layer as the upper layer and an n-type layer as the lower layer is also possible.

As has been explained above, in the integrated LED/driving-IC chip 200 of the second embodiment, since the LED epitaxial film 204 is divided into small parts, the material cost can be further reduced.

In the integrated LED/driving-IC chip 200 of the second embodiment, further, the LED epitaxial films 204 are divided to be small. As a result, a problem with the internal stress of the LED epitaxial films 204 involved when the thermal expansion coefficient of the LED epitaxial films 204 and the thermal expansion coefficient of the Si substrate 101 are largely different, can be reduced, and thus one of factors causing a defect in the LED epitaxial films 204 can be eliminated. For this reason, the integrated LED/driving-IC chip 200 of the second embodiment can be increased in reliability.

In the integrated LED/driving-IC chip 200 of the second embodiment, furthermore, the LED epitaxial films 204 are divided to be small and the bonding area is small. Thus a process of tightly bonding the LED epitaxial films 204 to the metal layers 103 can be facilitated, and therefore a defect generation rate caused by incomplete adhesion can be decreased.

In the integrated LED/driving-IC chip 200 of the second embodiment, furthermore, since the LED epitaxial film 204 has only light-emitting regions, the width of the LED epitaxial film 204 can be made small and the length of the individual interconnecting lines 106 can be made short.

The second embodiment is substantially the same as the above first embodiment, except for the above-described respects.

Third Embodiment

Figure 13:
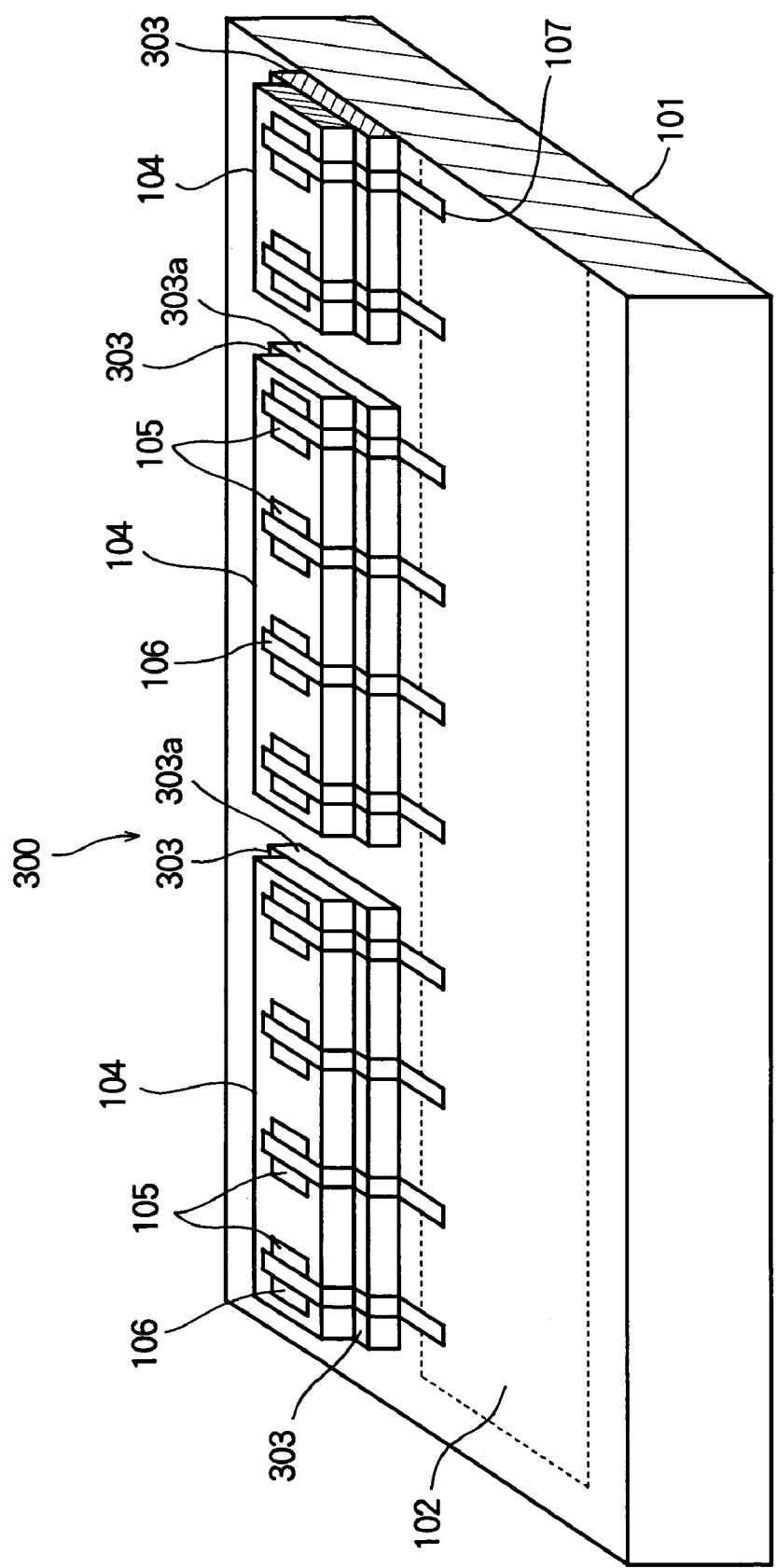
FIG. 13 is a perspective view schematically showing a part of an integrated LED/driving-IC chip in accordance with a third embodiment of the present invention.
Figure 14:
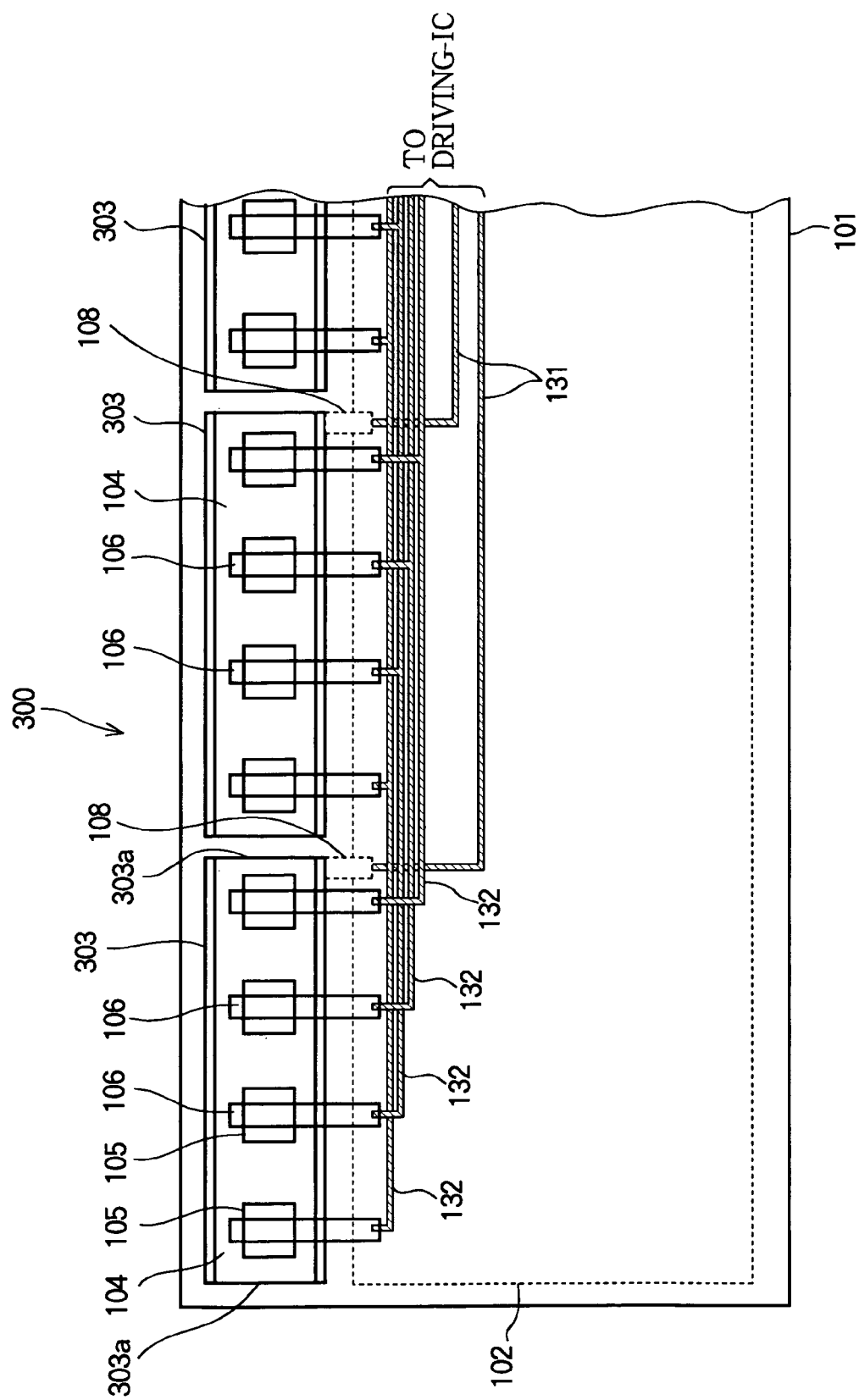
FIG. 14 is a plan view schematically showing a part of the integrated LED/driving-IC chip of the third embodiment.
Figure 15:
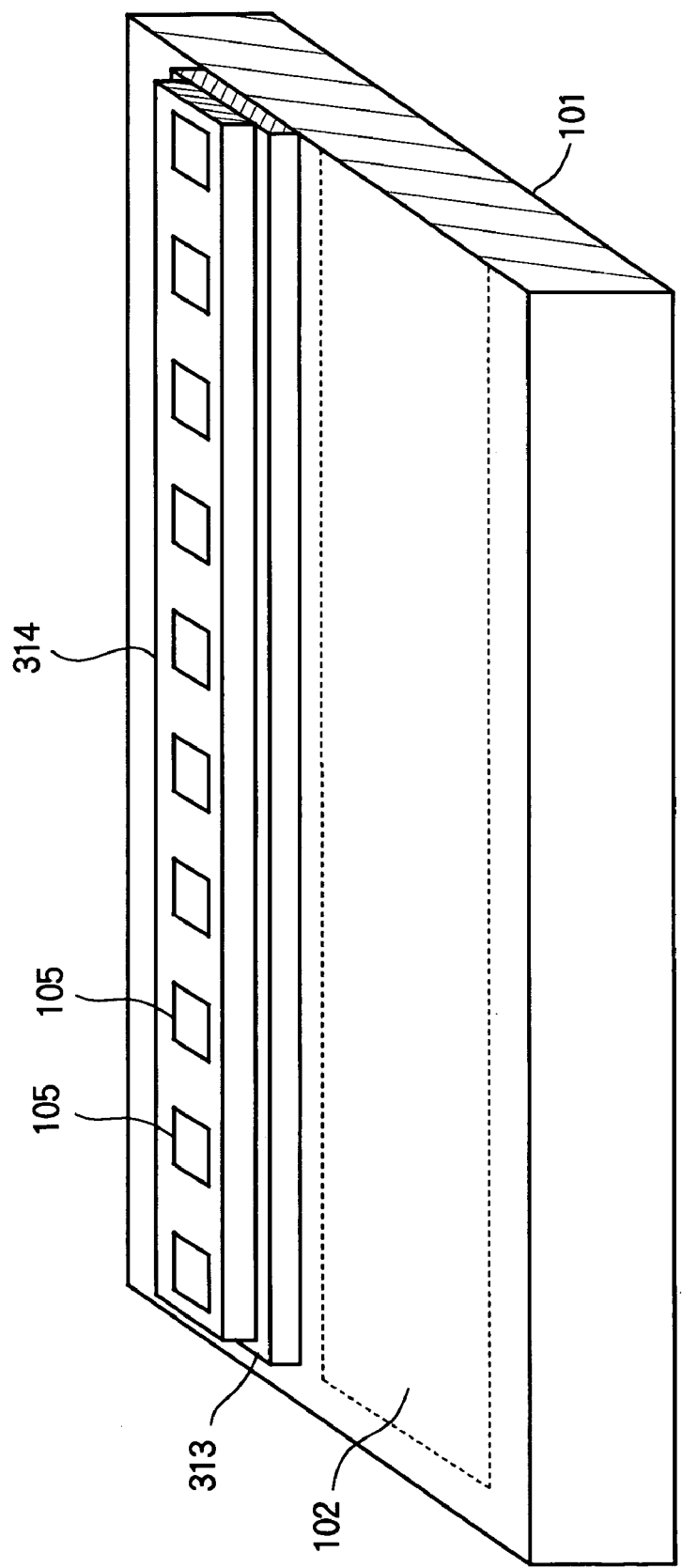
FIG. 15 is a perspective view schematically showing the integrated LED/driving-IC chip of the third embodiment.
Figure 16:
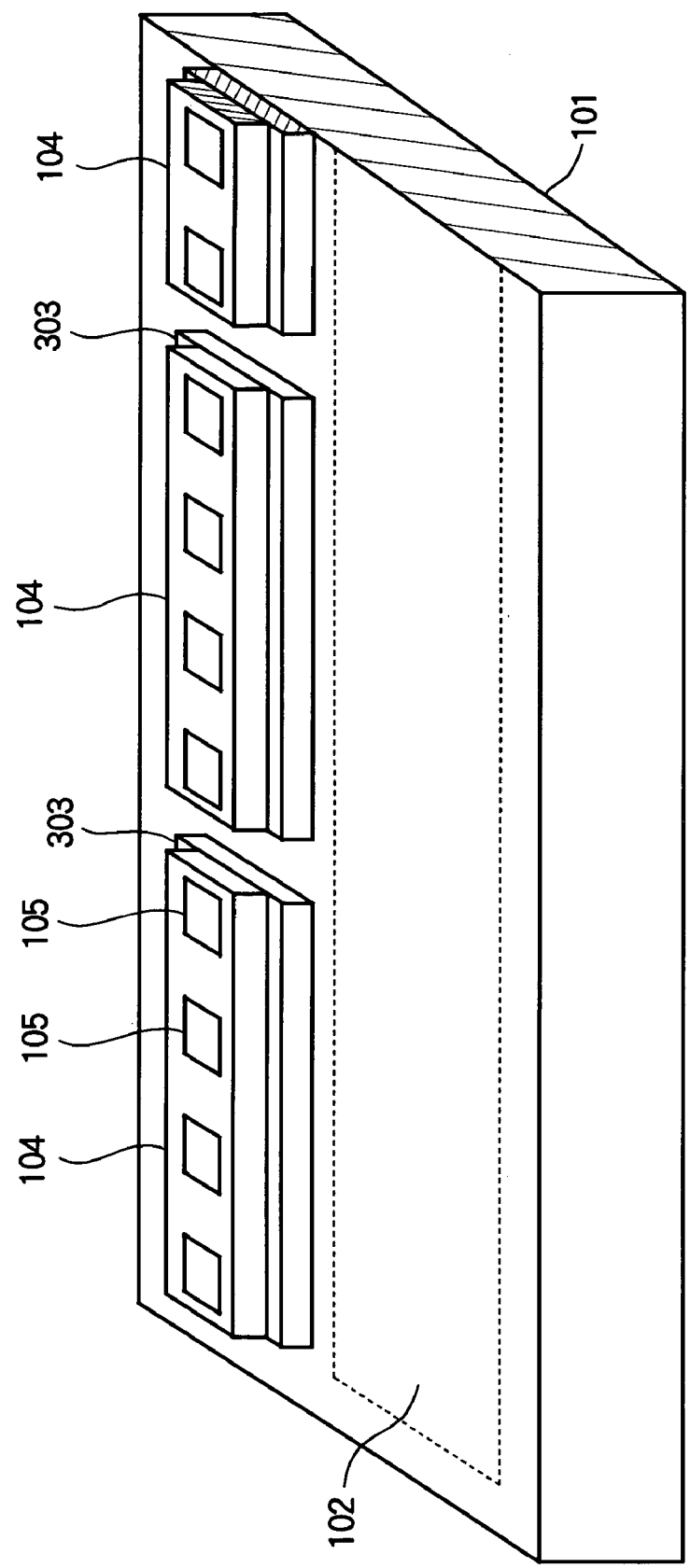
FIG. 16 is a perspective view for explaining a process of fabricating the integrated LED/driving-IC chip of the third embodiment.

FIG. 13 is a perspective view schematically showing a part of an integrated LED/driving-IC chip 300 in accordance with a third embodiment of the present invention, and FIG. 14 is a plan view schematically showing a part of the integrated LED/driving-IC chip 300 of the third embodiment. Further, FIGS. 15 and 16 are perspective views schematically showing a process of fabricating an integrated LED/driving-IC chip 300 of the third embodiment.

In FIG. 13, parts that are the same as or correspond to those in FIG. 1 (first embodiment) are denoted by the same reference numerals. In FIG. 14, parts that are the same as or correspond to those in FIG. 2 (first embodiment) are denoted by the same reference numerals. In the integrated LED/driving-IC chip 300 shown in FIGS. 13 and 14, ends 303a of metal layers 303 in an LED array direction (i.e., a direction of a row of the LEDs 105) and ends of the LED epitaxial films 104 are located on an imaginary identical plane (not shown in the figures) perpendicular to the surface of the Si substrate 101, that is, are aligned with one another. For fabricating such a structure, as shown in FIG. 15, an elongated metal layer 313 before a separating process is formed on the Si substrate 101, and an LED epitaxial film 314 before the separating process is bonded on the metal layer 313. Next, as shown in FIG. 16, the LED epitaxial film 314 and the metal layer 313 provided thereunder are partially removed with use of an etching mask (not shown in the figures) to create separated metal layers 303 and separated LED epitaxial films 104. Through such a process, the ends 303a of the separated metal layers 303 and the ends of the separated LED epitaxial films 104 can be aligned with each other, as shown in FIGS. 13 and 14.

As has been explained above, in the integrated LED/driving-IC chip 300 of the third embodiment, since the separated metal layers 303 can be aligned with the ends of the separated LED epitaxial films 104, no misalignment between the ends of the metal layers 303 and the ends of the LED epitaxial films will take place. For this reason, a defect (e.g., a damage in the LED epitaxial films) caused by a deviation in the bonding position of the LED epitaxial films 104 can be avoided.

The third embodiment is substantially the same as the foregoing first or second embodiment, except for the above-described respects.

LED Print Head

Figure 17:
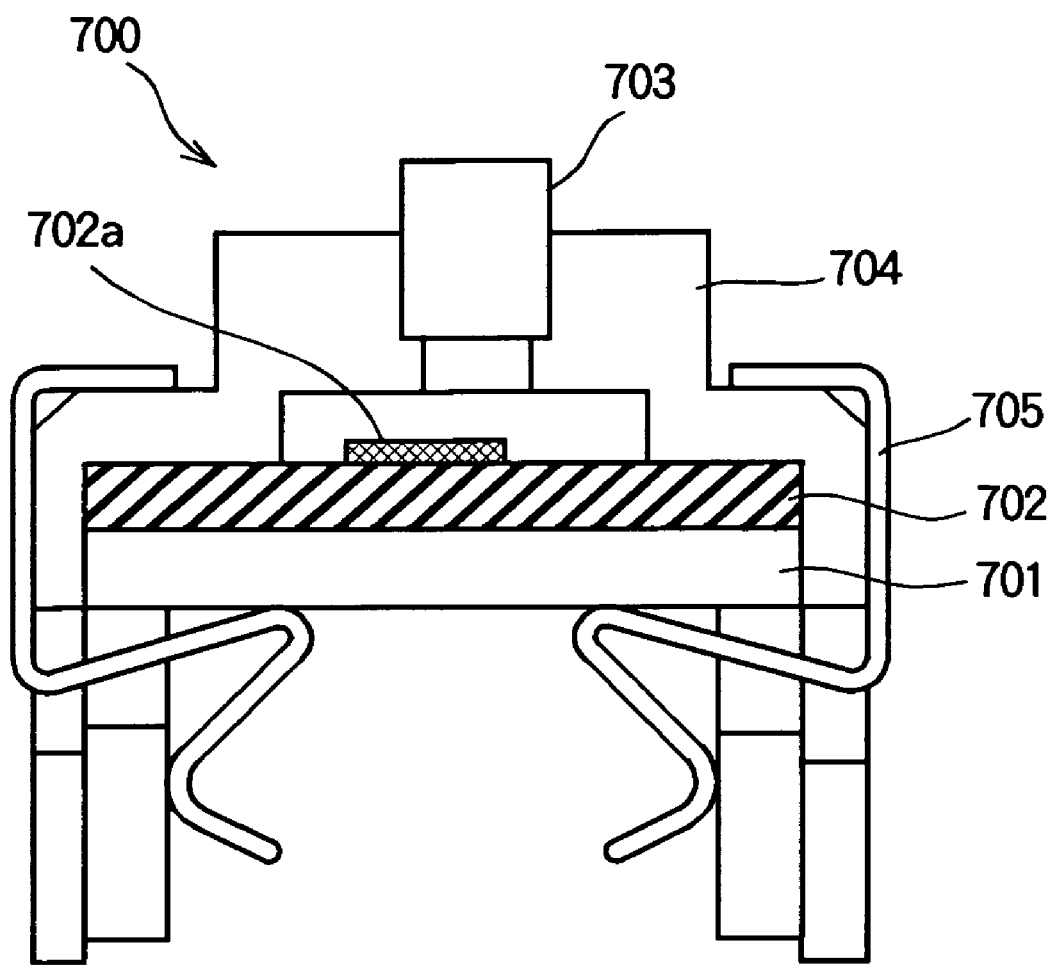
FIG. 17 is a schematic cross sectional view showing an LED print head equipped with the semiconductor apparatus of the present invention.

FIG. 17 is a schematic cross sectional view of an LED print head 700 having the semiconductor apparatus of the present invention built therein. As shown in FIG. 17, the LED print head 700 includes a base 701 on which an LED unit 702 is mounted. The LED unit 702 includes a plurality of integrated LED/driving-IC chips 702a of the type described in any of the preceding embodiments, mounted so that their light-emitting parts are positioned beneath a rod lens array 703. The rod lens array 703 is supported by a holder 704. The base 701, LED unit 702, and holder 704 are held together by clamps 705. Light emitted by the light-emitting elements in the LED unit 702 is focused by rod lenses in the rod lens array 703 onto, for example, a photosensitive drum (not shown) in an electrophotographic printer or copier.

Use of integrated LED/driving-IC chips 702a instead of the conventional paired LED array chips and driver IC chips enables the LED unit 702 to be reduced in size and reduces its assembly cost, as there are fewer chips to be mounted.

LED Printer

Figure 18:
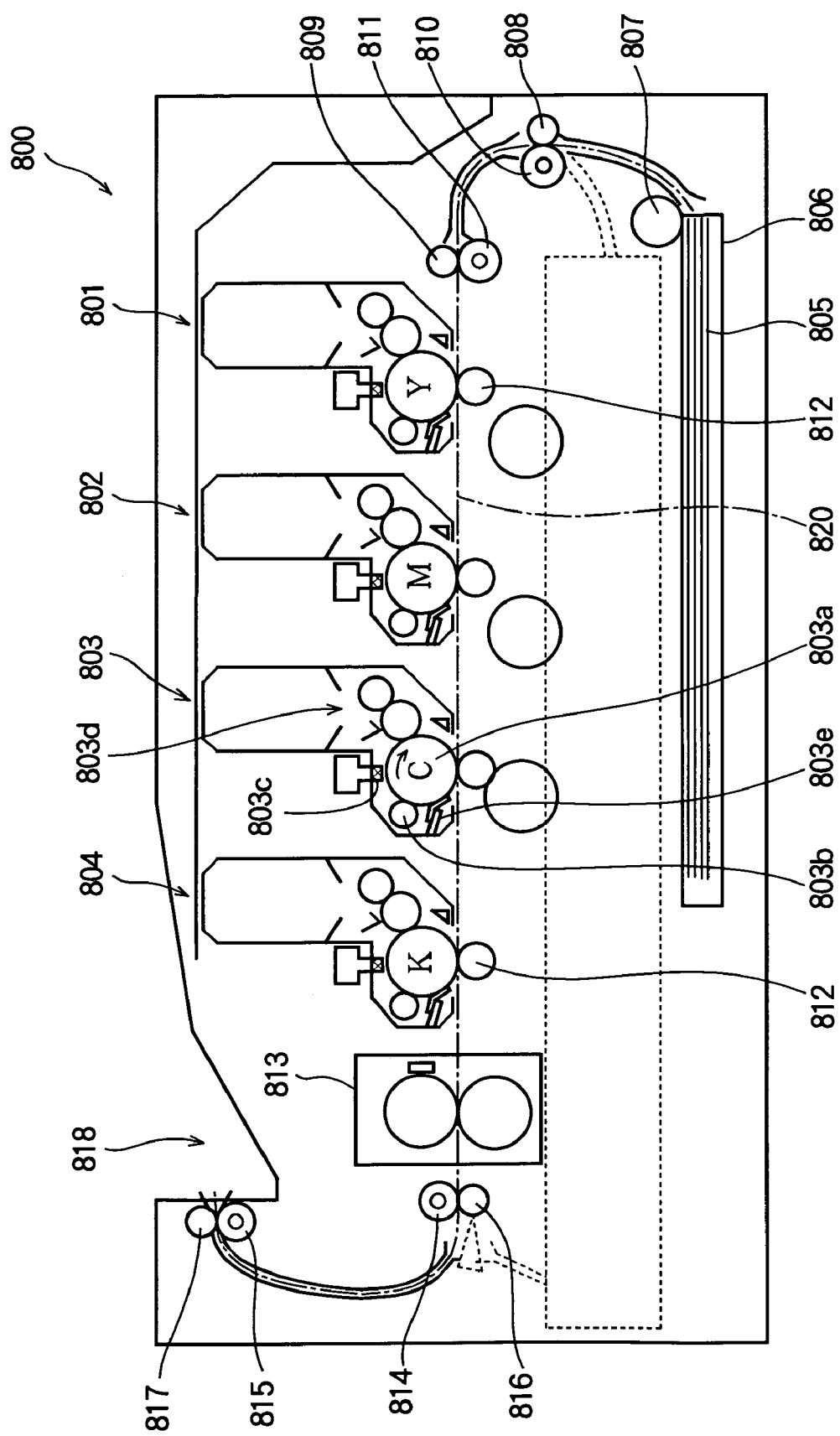
FIG. 18 is a schematic cutaway side view of an LED printer employing the invented semiconductor apparatus.
Figure 19:
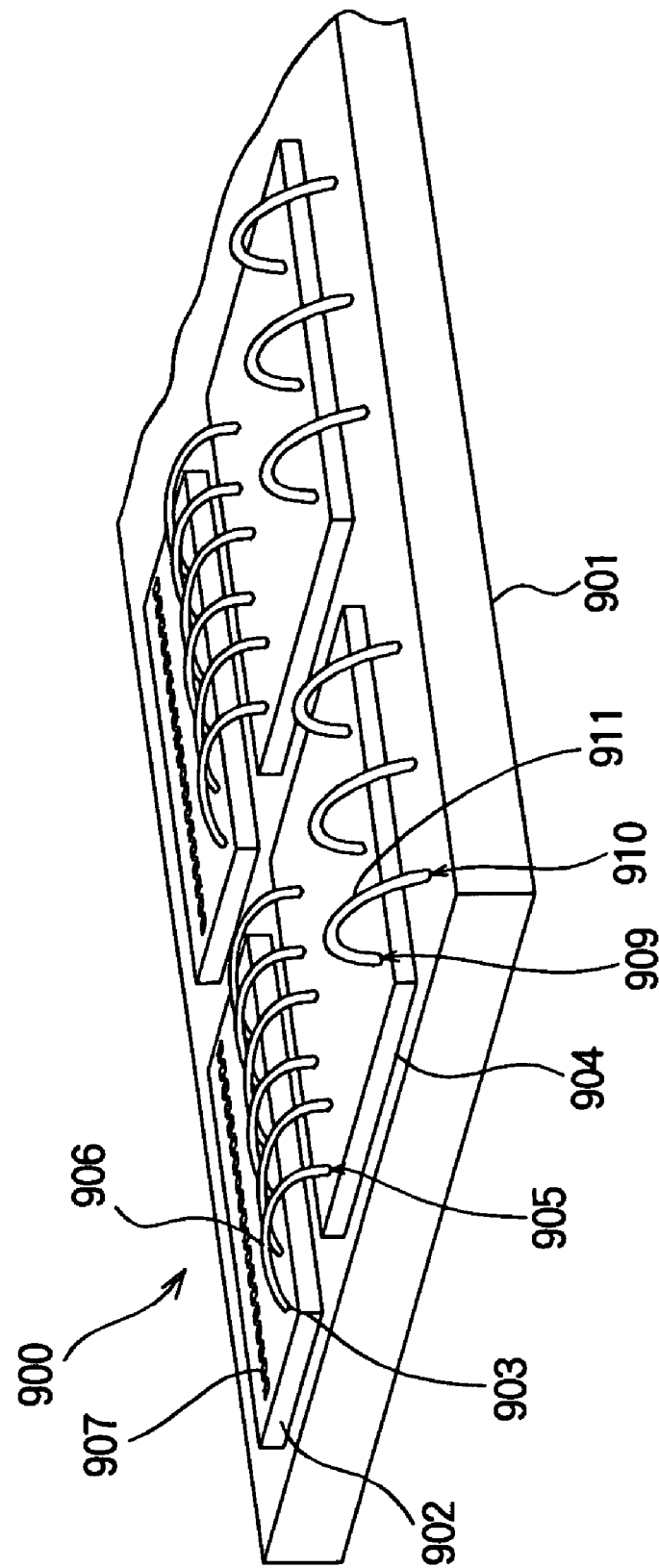
FIG. 19 is a perspective view schematically showing a part of a conventional LED print unit.
Figure 20:
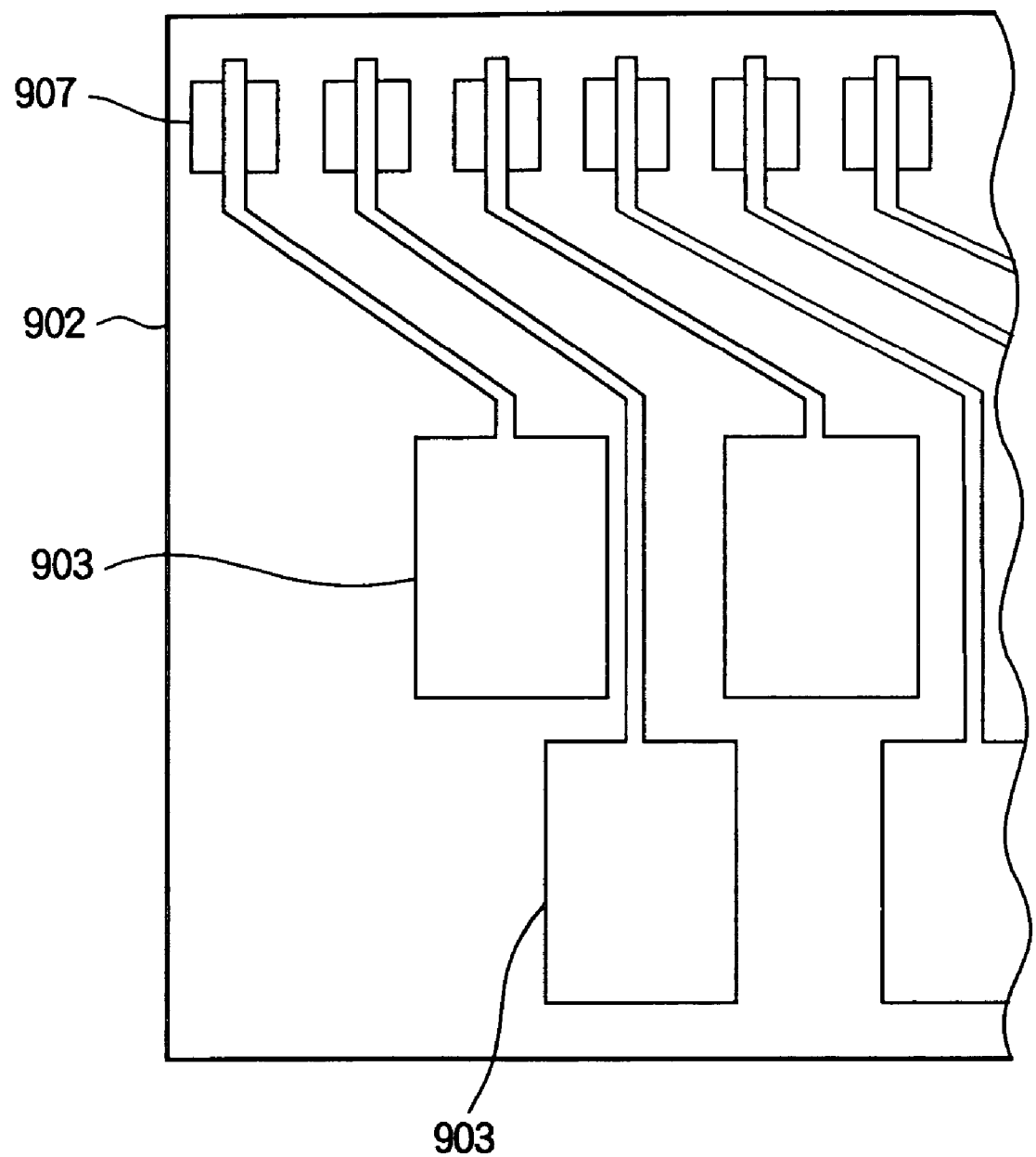
FIG. 20 is a plan view schematically showing a part of an LED array chip provided in the LED print unit of FIG. 19.

FIG. 18 shows an example of a full-color LED printer 800 in which the present invention may be employed. The printer 800 has a yellow (Y) process unit 801, a magenta (M) process unit 802, a cyan (C) process unit 803, and a black (K) process unit 804, which are mounted following one another in tandem fashion. The cyan process unit 803, for example, includes a photosensitive drum 803a that turns in the direction indicated by the arrow, a charging unit 803b that supplies current to the photosensitive drum 803a to charge the surface thereof, an LED print head 803c that selectively illuminates the charged surface of the photosensitive drum 803a to form an electrostatic latent image, a developing unit 803d that supplies cyan toner particles to the surface of the photosensitive drum 803a to develop the electrostatic latent image, and a cleaning unit 803e that removes remaining toner from the photosensitive drum 803a after the developed image has been transferred to paper. The LED print head 803c has, for example, the structure shown in FIG. 17, including integrated LED/driving-IC chips 702*a* of the type described in any of the nine embodiments above. The other process units 801, 802, 804 are similar in structure to the cyan process unit 803, but use different toner colors.

The paper 805 (or other media) is held as a stack of sheets in a cassette 806. A hopping roller 807 feeds the paper 805 one sheet at a time toward a paired transport roller 810 and pinch roller 808. After passing between these rollers, the paper 805 travels to a registration roller 811 and pinch roller 809, which feed the paper toward the yellow process unit 801.

The paper 810 passes through the process units 801, 802, 803, 804 in turn, traveling in each process unit between the photosensitive drum and a transfer roller 812 made of, for example, semi-conductive rubber. The transfer roller 812 is charged so as to create a potential difference between it and the photosensitive drum. The potential difference attracts the toner image from the photosensitive drum onto the paper 805. A full-color image is built up on the paper 805 in four stages, the yellow process unit 801 printing a yellow image, the magenta process unit 802 a magenta image, the cyan process unit 803 a cyan image, and the black process unit 804 a black image.

From the black process unit 804, the paper 805 travels through a fuser 813, in which a heat roller and back-up roller apply heat and pressure to fuse the transferred toner image onto the paper. A first delivery roller 814 and pinch roller 816 then feed the paper 805 upward to a second delivery roller 815 and pinch roller 817, which deliver the printed paper onto a stacker 818 at the top of the printer.

The photosensitive drums and various of the rollers are driven by motors and gears not shown in the drawing. The motors are controlled by a control unit (not shown) that, for example, drives the transport roller 810 and halts the registration roller 811 until the front edge of a sheet of paper 805 rests flush against registration roller 811, then drives the registration roller 811, thereby assuring that the paper 805 is correctly aligned during its travel through the process units 801, 802, 803, 804. The transport roller 810, registration roller 811, delivery rollers 814, 815, and pinch rollers 808, 809, 816, 817 also have the function of changing the direction of travel of the paper 805.

The LED heads account for a significant part of the manufacturing cost of this type of LED printer 800. By using highly reliable and space-efficient integrated LED/driving-IC chips and enabling these chips and the LED units in the LED heads to be manufactured by a simplified fabrication process with reduced material costs, the present invention enables a high-quality printer to be produced at a comparatively low cost.

Similar advantages are obtainable if the invention is applied to a full-color copier. The invention can also be advantageously used in a monochrome printer or copier or a multiple-color printer or copier, but its effect is particularly great in a full-color image-forming apparatus (printer or copier), because of the large number of exposure devices (print heads) required in such apparatus.

Modifications of Embodiments

Although explanation has been made in the foregoing embodiments in connection with the case where the planarized film on the Si substrate includes the metal layer, the metal layer 103 may be replaced by a electrically conductive thin layer such as polysilicon, electrically conductive oxide (ITO, ZnO), or the like.

Although explanation has been made in the foregoing embodiments in connection with the case where the semiconductor devices provided to the semiconductor thin films are the LEDs 105, the semiconductor device may be another light-emitting element such as a laser, a light-sensing element, a Hall element, or a piezoelectric element.

Explanation has been made in the foregoing embodiments in connection with the case where the LED epitaxial films 104 are epitaxial layers. However, a semiconductor thin film not as the epitaxial layer may be employed in place of the LED epitaxial film.

What is claimed is:

1. An optical print head including a semiconductor apparatus, the semiconductor apparatus comprising:
    a substrate;
    m electrically conductive layers formed on said substrate, m being an integer of 2 or more, potentials of said m electrically conductive layers being capable of being independently controlled;
    m semiconductor thin films, each including n semiconductor devices, each semiconductor device including a second-conductive-type semiconductor layer so that there are n second-conductive-type semiconductor layers, n being an integer of 2 or more, said m semiconductor thin films being bonded on surfaces of said m electrically conductive layers respectively in a one-to-one correspondence;
    m common wiring lines disposed on said substrate, potentials of said m common wiring lines being capable of being independently controlled, said m common wiring lines being respectively electrically connected to said m electrically conductive layers in a one-to-one correspondence; and
    n signal wiring lines disposed on said substrate, potentials of said n signal wiring lines being capable of being independently controlled;
    wherein said n second-conductive-type semiconductor layers are disposed on each of said m electrically conductive layers and are electrically connected to said n signal wiring lines so that a k-th one of said n second-conductive-type semiconductor layers and a k-th one of said n signal wiring lines are electrically connected in a one-to-one correspondence, k being an integer between 1 and n.

2. An optical print head including a semiconductor apparatus, the semiconductor apparatus, comprising:
    a substrate;
    m electrically conductive layers formed on said substrate, m being an integer of 2 or more, potentials of said m electrically conductive layers being capable of being independently controlled;
    m semiconductor thin films, each including n semiconductor devices, n being an integer of 2 or more, said m semiconductor thin films being bonded on surfaces of said m electrically conductive layers respectively in a one-to-one correspondence;
    m common wiring lines disposed on said substrate, potentials of said m common wiring lines being capable of being independently controlled, said m common wiring lines being respectively electrically connected to said m electrically conductive layers in a one-to-one correspondence; and
    n signal wiring lines disposed on said substrate, potentials of said n signal wiring lines being capable of being independently controlled;
    wherein said n semiconductor devices are disposed on each of said m electrically conductive layers and are electrically connected to said n signal wiring lines so that a k-th one of said n semiconductor devices and a k-th one of said n signal wiring lines are electrically connected in a one-to-one correspondence, k being an integer between 1 and n.

3. An image-forming apparatus, comprising:
the optical print head of claim 1;
a photosensitive drum selectively illuminated by the optical print head to form a latent electrostatic image; and
a developing unit for supplying toner to develop the latent electrostatic image on the photosensitive drum.

4. An image-forming apparatus, comprising:
the optical print head of claim 2;
a photosensitive drum selectively illuminated by the optical print head to form a latent electrostatic image; and
a developing unit for supplying toner to develop the latent electrostatic image on the photosensitive drum.

5. An optical print head including a semiconductor apparatus, the semiconductor apparatus comprising:
a substrate;
m electrically conductive layers, m being an integer of 2 or more;
m common wiring lines disposed on said substrate, potentials of said m common wiring lines being capable of being independently controlled, said m common wiring lines being respectively electrically connected to said m electrically conductive layers in a one-to-one correspondence; and
n signal wiring lines disposed on said substrate, potentials of said n signal wiring lines being capable of being independently controlled, n being an integer of 2 or more;
wherein n second-conductive-type semiconductor layers are disposed on each of said m electrically conductive layers and are electrically connected to said n signal wiring lines so that a k-th one of said n second-conductive-type semiconductor layers and a k-th one of said n signal wiring lines are electrically connected in a one-to-one correspondence, k being an integer between 1 and n.

* * * * *